(12) United States Patent
Oota et al.

(10) Patent No.: US 10,438,946 B2
(45) Date of Patent: Oct. 8, 2019

(54) SEMICONDUCTOR DEVICE AND ELECTRICAL APPARATUS

(71) Applicant: Kabushiki Kaisha Toshiba, Minato-ku, Tokyo (JP)

(72) Inventors: Tsuyoshi Oota, Ibo Hyogo (JP); Hiroko Nonaka, Nomi Ishikawa (JP); Asami Gorohmaru, Himeji Hyogo (JP); Toshiyuki Naka, Nonoichi Ishikawa (JP); Norio Yasuhara, Kanazawa Ishikawa (JP)

(73) Assignee: Kabushiki Kaisha Toshiba, Minato-Ku, Tokyo (JP)

( * ) Notice: Subject to any disclaimer, the term of this patent is extended or adjusted under 35 U.S.C. 154(b) by 0 days.

(21) Appl. No.: 15/690,606

(22) Filed: Aug. 30, 2017

(65) Prior Publication Data

US 2018/0226397 A1    Aug. 9, 2018

(30) Foreign Application Priority Data

Feb. 9, 2017    (JP) ................................. 2017-022569

(51) Int. Cl.
*H01L 27/06*    (2006.01)
*H01L 29/06*    (2006.01)
(Continued)

(52) U.S. Cl.
CPC ...... *H01L 27/0635* (2013.01); *H01L 29/0696* (2013.01); *H01L 29/0834* (2013.01);
(Continued)

(58) Field of Classification Search
None
See application file for complete search history.

(56) References Cited

U.S. PATENT DOCUMENTS

| 8,847,276 B2 | 9/2014 | Tanabe et al. |
| 9,023,692 B2 | 5/2015 | Yoshida et al. |

(Continued)

FOREIGN PATENT DOCUMENTS

| JP | 2010-263215 A | 11/2010 |
| JP | 2014-063961 A | 4/2014 |

(Continued)

*Primary Examiner* — Telly D Green
(74) *Attorney, Agent, or Firm* — White & Case LLP

(57) ABSTRACT

According to an embodiment, a semiconductor device includes a first electrode, a first semiconductor region of a first conductivity type, second semiconductor regions of a second conductivity type, a third semiconductor region of the second conductivity type, a fourth semiconductor region of the first conductivity type, a fifth semiconductor region of the second conductivity type, a gate electrode, and a second electrode. The first semiconductor region is provided on the first electrode. The first semiconductor region includes first portions and first protruding portions. The first portions are arranged along a first direction and a second direction perpendicular to the first direction. The first protruding portions respectively protrude from the first portions. The second semiconductor regions are spaced from each other and provided in the first semiconductor region. The third semiconductor region is provided on the first semiconductor region and the second semiconductor regions.

20 Claims, 21 Drawing Sheets

(51) Int. Cl.
*H01L 29/739* (2006.01)
*H01L 29/08* (2006.01)
*H01L 29/861* (2006.01)
*H01L 27/07* (2006.01)

(52) U.S. Cl.
CPC ...... *H01L 29/7397* (2013.01); *H01L 27/0727* (2013.01); *H01L 29/083* (2013.01); *H01L 29/0821* (2013.01); *H01L 29/8611* (2013.01)

(56) References Cited

U.S. PATENT DOCUMENTS

2010/0276727 A1 11/2010 Storasta et al.
2013/0087829 A1 4/2013 Tanabe et al.
2014/0070270 A1 3/2014 Yoshida et al.

FOREIGN PATENT DOCUMENTS

JP 2014-075582 A 4/2014
JP 2014-220519 A 11/2014

SEMICONDUCTOR DEVICE AND ELECTRICAL APPARATUS

CROSS-REFERENCE TO RELATED APPLICATIONS

This application is based upon and claims the benefit of priority from Japanese Patent Application No. 2017-022569, filed on Feb. 9, 2017; the entire contents of which are incorporated herein by reference.

FIELD

Embodiments described herein relate generally to a semiconductor device and an electrical apparatus.

BACKGROUND

As a semiconductor device used for e.g. power conversion, there is known an RC-IGBT (reverse conducting insulated gate bipolar transistor) in which an FWD (free wheeling diode) is incorporated in an IGBT (insulated gate bipolar transistor). For a semiconductor device, lower power loss is desired.

DETAILED DESCRIPTION

Figure 1:
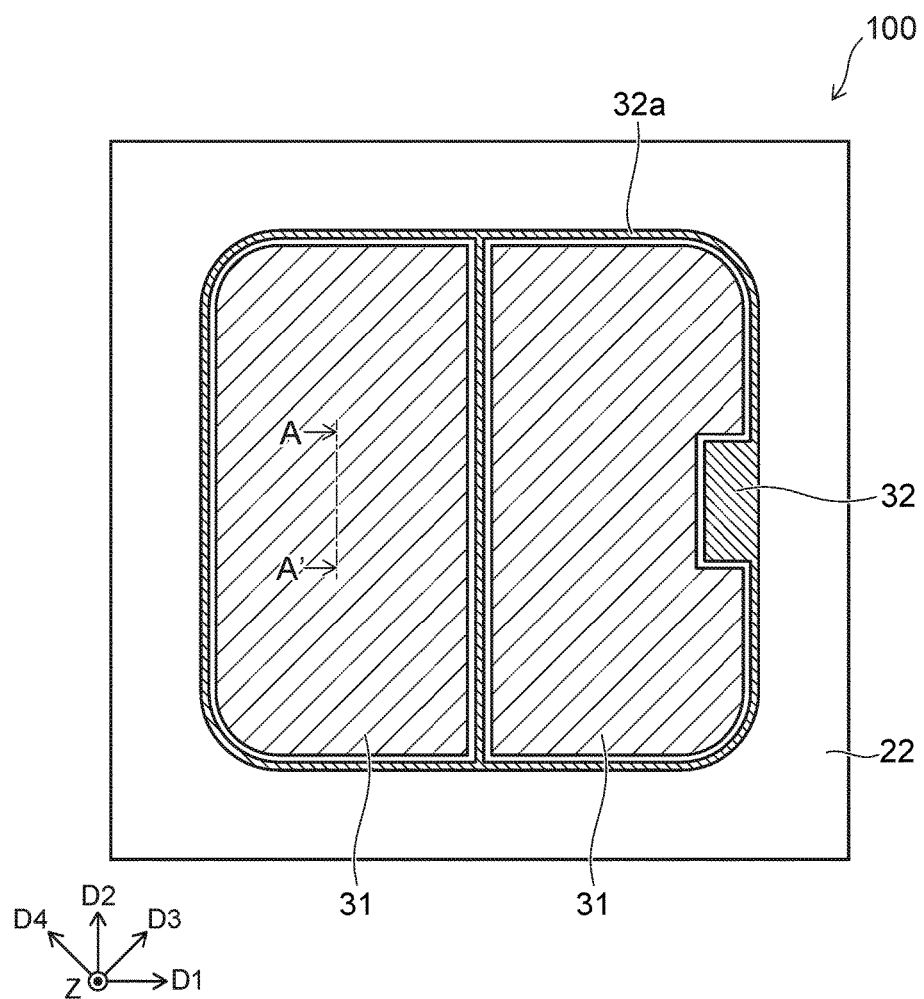
FIG. 1 is a plan view showing a semiconductor device according to a first embodiment.

According to an embodiment, a semiconductor device includes a first electrode, a first semiconductor region of a first conductivity type, a plurality of second semiconductor regions of a second conductivity type, a third semiconductor region of the second conductivity type, a fourth semiconductor region of the first conductivity type, a fifth semiconductor region of the second conductivity type, a gate electrode, and a second electrode. The first semiconductor region is provided on the first electrode. The first semiconductor region includes a plurality of first portions and a plurality of first protruding portions. The first portions are arranged along a first direction and a second direction perpendicular to the first direction. The first protruding portions respectively protrude from the first portions. The second semiconductor regions are spaced from each other. The second semiconductor regions are provided in the first semiconductor region other than the first portions and the first protruding portions. The third semiconductor region is provided on the first semiconductor region and the second semiconductor regions. The fourth semiconductor region of the first conductivity type is provided on the third semiconductor region. The fifth semiconductor region is selectively provided on the fourth semiconductor region. The gate electrode is opposed to the fourth semiconductor region with a gate insulating layer interposed. The second electrode is provided on the fifth semiconductor region.

Embodiments of the invention will now be described with reference to the drawings.

The drawings are schematic or conceptual; and the relationships between the thicknesses and widths of portions, the proportions of sizes between portions, etc., are not necessarily the same as the actual values thereof. The dimensions and/or the proportions may be illustrated differently between the drawings, even in the case where the same portion is illustrated.

In the drawings and the specification of the application, components similar to those described thereinabove are marked with like reference numerals, and a detailed description is omitted as appropriate.

A first direction D1, a second direction D2, a third direction D3, a fourth direction D4, and Z-direction (a fifth direction) is used in the description of the embodiments. The Z-direction is from a collector electrode 30 toward an emitter electrode 31. The first direction D1 and the second direction D2 are perpendicular to the Z-direction and orthogonal to each other. The third direction D3 and the fourth direction D4 are perpendicular to the Z-direction and cross the first direction D1 and the second direction D2. The third direction D3 and the fourth direction D4 cross each other and are, for example, orthogonal to each other.

In the following description, the notations of $n^+$, n, $n^-$, $p^+$, p, and $p^-$ indicate relative levels of the impurity concentrations of the conductivity types. In other words, a notation marked with "+" indicates an impurity concentration relatively higher than a notation not marked with either "+" or "−;" and a notation marked with "−" indicates an impurity concentration relatively lower than a notation not marked with either "+" or "−."

The embodiments described below may be implemented by reversing the p-type and the n-type of the semiconductor regions.

First Embodiment

FIG. 1 is a plan view showing a semiconductor device 100 according to a first embodiment.

Figure 2:
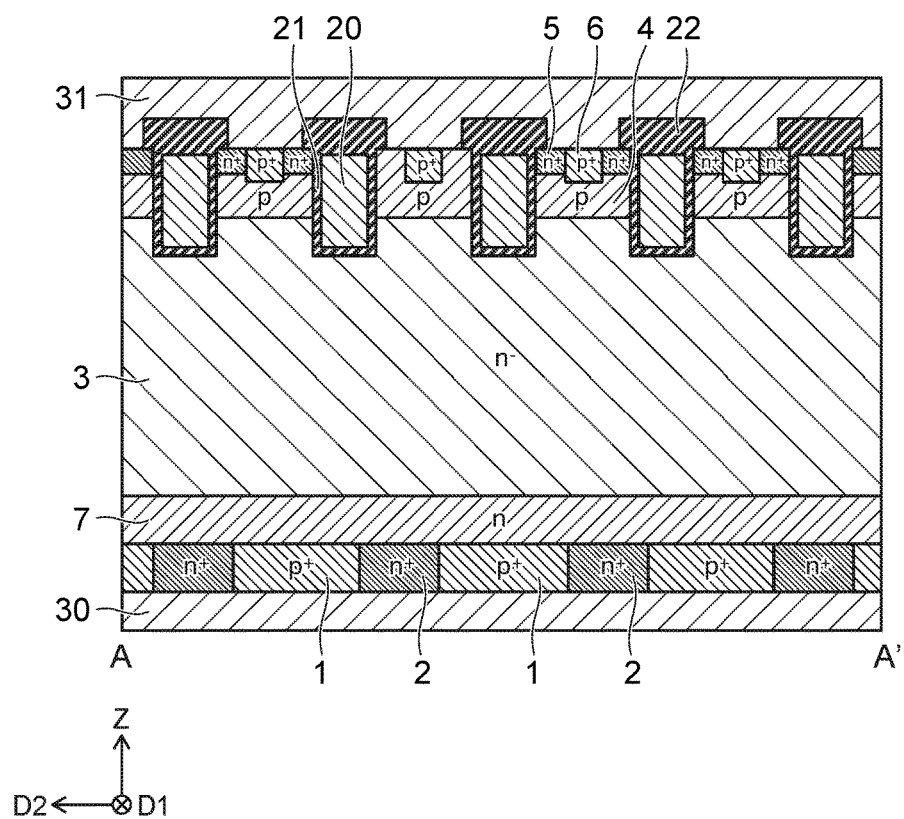
FIG. 2 is a sectional view taken along A-A' in FIG. 1.

FIG. 2 is a sectional view taken along A-A' in FIG. 1.

Figure 3:
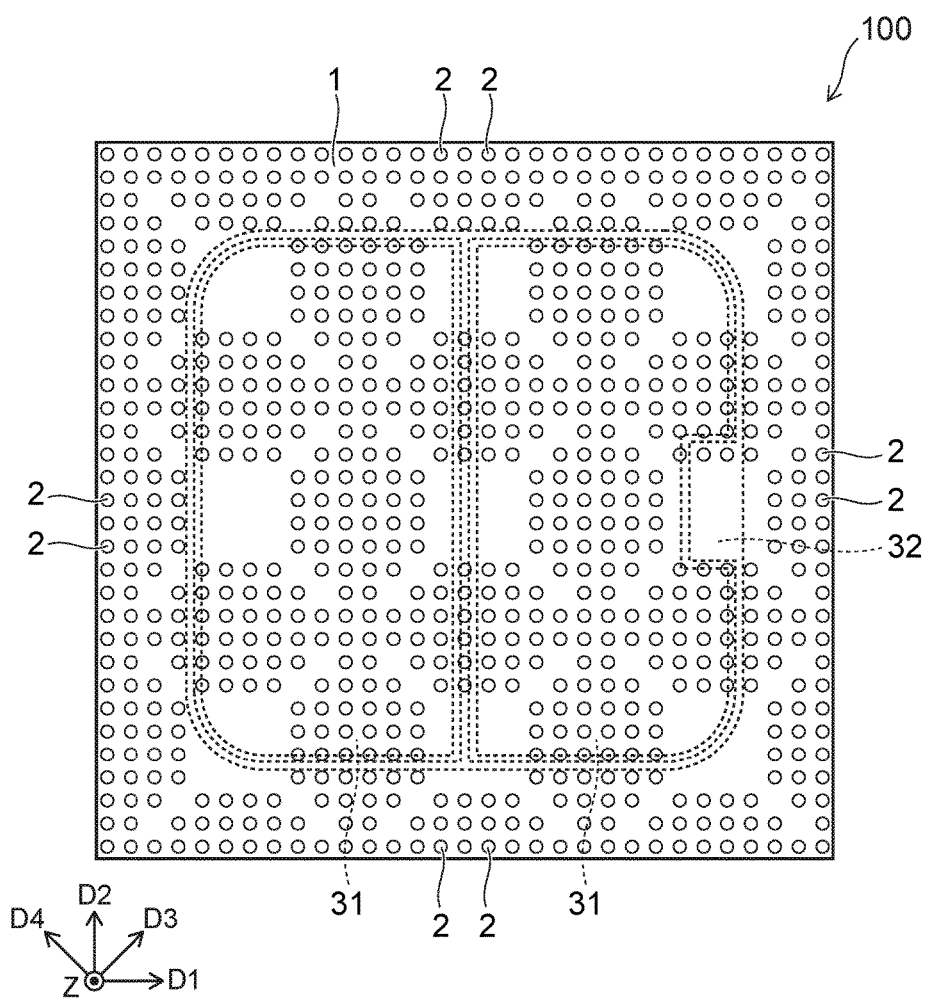
FIGS. 3 and 4 are plan views showing the placement of a $p^+$-type collector region and $n^+$-type cathode regions of the semiconductor device according to the first embodiment.
Figure 4:
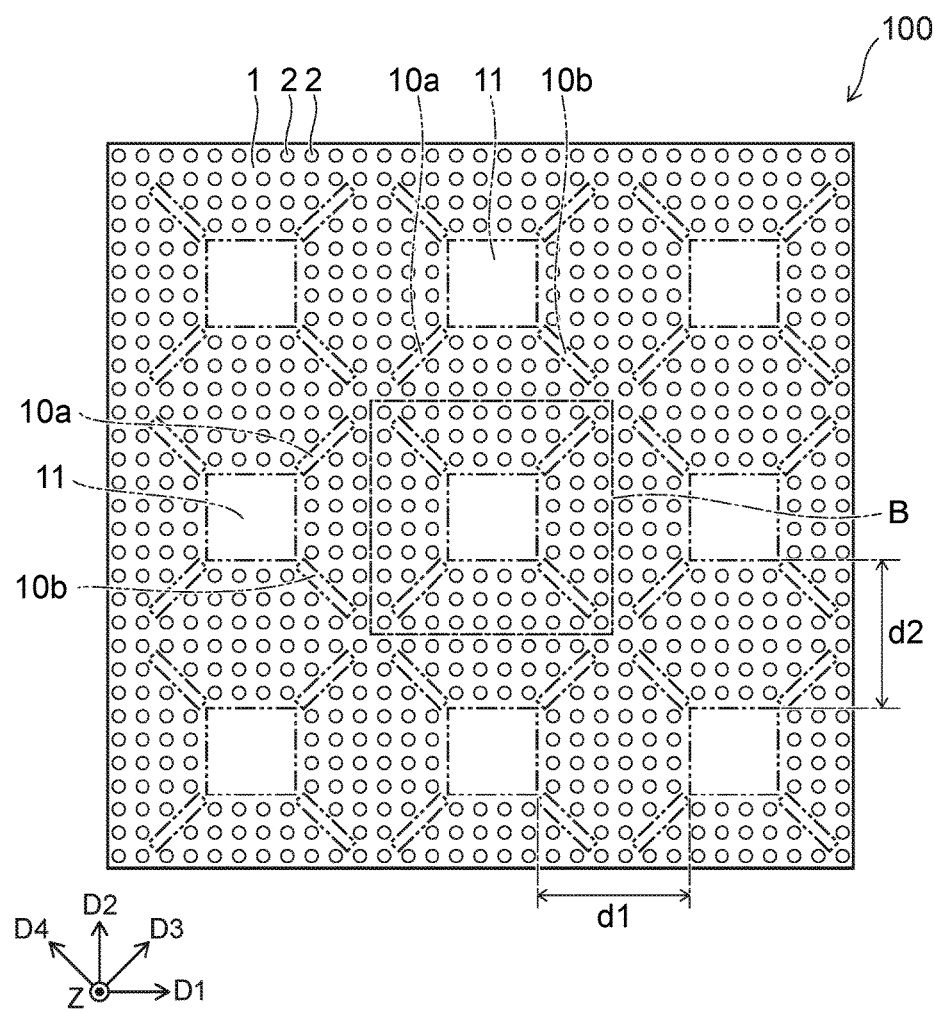

FIGS. 3 and 4 are plan views showing the placement of a $p^+$-type collector region 1 and $n^+$-type cathode regions 2 of the semiconductor device 100 according to the first embodiment.

Figure 5:
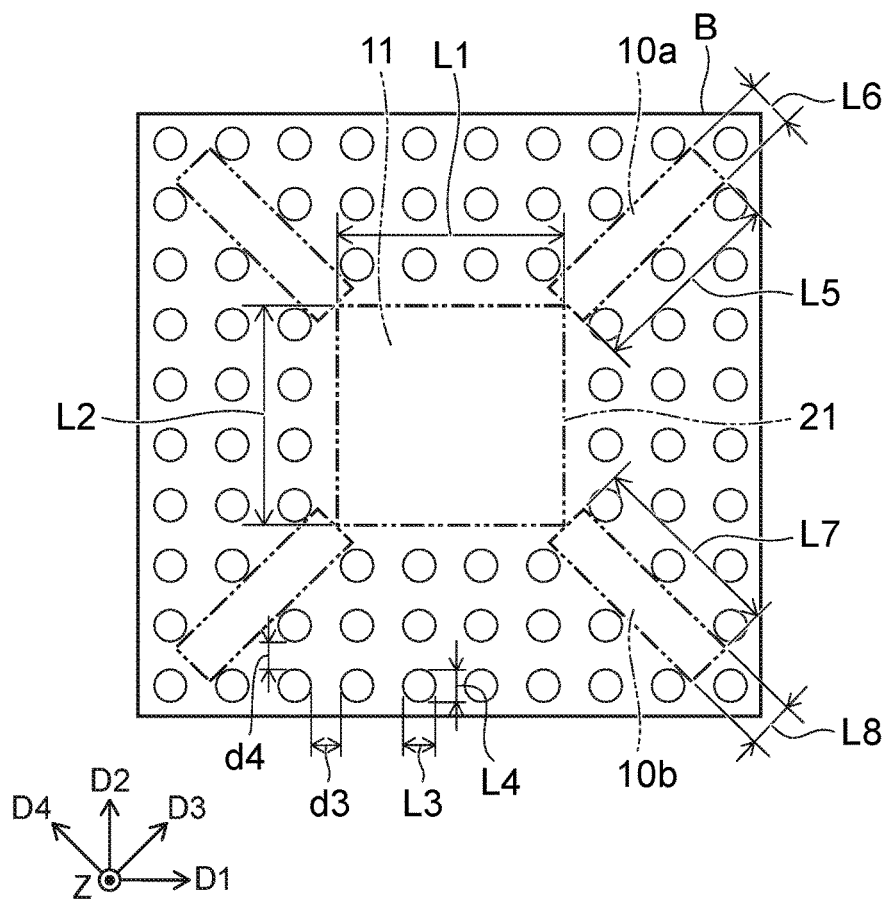
FIG. 5 is a plan view enlarging the region B of FIG. 4.

FIG. 5 is a plan view enlarging the region B of FIG. 4.

In FIG. 3, the emitter electrode 31 and the gate pad 32 are shown by dashed lines.

The semiconductor device 100 is an RC-IGBT.

As shown in FIGS. 1 to 3, the semiconductor device 100 includes a $p^+$-type collector region 1 (first semiconductor region), an $n^+$-type cathode region 2 (second semiconductor region), an $n^-$-type semiconductor region 3 (third semiconductor region), a p-type base region 4 (fourth semiconductor region), an $n^+$-type emitter region 5 (fifth semiconductor region), a $p^+$-type contact region 6, a gate electrode 20, a gate insulating layer 21, an insulating layer 22, a collector electrode 30 (first electrode), an emitter electrode 31 (second electrode), and a gate pad 32.

In the semiconductor device 100, the region provided with the $p^+$-type collector region 1 and the gate electrode 20 operates as an IGBT. The region provided with the $n^+$-type cathode region 2 operates as an FWD.

As shown in FIG. 1, the emitter electrode 31 and the gate pad 32 are provided at the upper surface of the semiconductor device 100 and spaced from each other. The emitter electrode 31 is provided in a plurality in a first direction D1. The gate pad 32 includes a gate interconnect part 32a surrounding a plurality of emitter electrodes 31. Part of the gate interconnect part 32a extends in a second direction D2 between the emitter electrodes 31. The configuration of the emitter electrode 31 and the gate pad 32 is not limited to the example shown in FIG. 1, but can be modified as appropriate.

As shown in FIG. 2, the collector electrode 30 is provided at the lower surface of the semiconductor device 100.

The $p^+$-type collector region 1 and the $n^+$-type cathode region 2 are provided on the collector electrode 30 and electrically connected to the collector electrode 30.

The $n^-$-type semiconductor region 3 is provided on the $p^+$-type collector region 1 and the $n^+$-type cathode region 2.

As shown in FIG. 2, an n-type field stop region 7 may be provided between the $p^+$-type collector region 1 and the $n^-$-type semiconductor region 3 and between $n^+$-type cathode region 2 and the $n^-$-type semiconductor region 3.

The p-type base region 4 and the gate electrode 20 are provided on the $n^-$-type semiconductor region 3.

The $n^+$-type emitter region 5 and the $p^+$-type contact region 6 are selectively provided on the p-type base region 4.

The gate electrode 20 is opposed to the p-type base region 4 with the gate insulating layer 21 interposed in the second direction D2.

The p-type base region 4, the $n^+$-type emitter region 5, the $p^+$-type contact region 6, and the gate electrode 20 are provided in a plurality in the second direction D2. Each of the p-type base region 4, the $n^+$-type emitter region 5, the $p^+$-type contact region 6, and the gate electrode 20 extends in the first direction D1. As shown in FIG. 2, the $n^+$-type emitter region 5 may not be provided on part of the p-type base regions 4.

The emitter electrode 31 is provided on the $n^+$-type emitter region 5 and the $p^+$-type contact region 6 and electrically connected to these semiconductor regions. Between the gate electrode 20 and the emitter electrode 31, the insulating layer 22 is provided and electrically isolates these electrodes from each other.

Next, the $p^+$-type collector region 1 and the $n^+$-type cathode region 2 are described more specifically with reference to FIGS. 3 to 5.

As shown in FIGS. 3 and 4, the $n^+$-type cathode regions 2 are spaced from each other and provided in a plurality in the $p^+$-type collector region 1. As shown in FIG. 4, the $p^+$-type collector region 1 includes a plurality of first portions 11 (first portions), a plurality of protruding portions 10a, and a plurality of protruding portions 10b. The $n^+$-type cathode region 2 is not provided in these portions. The p-type impurity concentration in the first portion 11, the p-type impurity concentration in the protruding portion 10a, and the p-type impurity concentration in the protruding portion 10b are e.g. equal.

The plurality of first portions 11 are arranged with an approximately equal spacing along the first direction D1 and the second direction D2. Thus, the distance in the first direction D1 and the distance in the second direction D2 between the first portions 11 are respectively shorter than the distance in the third direction D3 and the distance in the fourth direction D4.

The protruding portion 10a protrudes from the first portion 11 along the third direction D3. The protruding portion 10b protrudes from the first portion 11 along the fourth direction D4. Part of the plurality of protruding portions 10a are provided between the first portions 11 in the third direction D3. Part of the plurality of protruding portions 10b are provided between the first portions 11 in the fourth direction D4.

As shown in FIG. 5, each of the length L1 in the first direction D1 and the length L2 in the second direction D2 of the first portion 11 is longer than the length L3 in the first direction D1 of the $n^+$-type cathode region 2 and longer than the length L4 in the second direction D2 of the $n^-$-type cathode region 2.

Each of the distance d1 in the first direction D1 and the distance d2 in the second direction D2 between the first portions 11 shown in FIG. 4 is longer than each of the distance d3 in the first direction D1 and the distance d4 in the second direction D2 between the n$^+$-type cathode regions 2 shown in FIG. 5. Each of the length L1 and the length L2 is longer than each of the distance d3 and the distance d4.

Each of the length L5 in the third direction D3 and the length L6 in the fourth direction D4 of the protruding portion 10a is longer than each of the distance d3 and the distance d4. Likewise, each of the length L7 in the fourth direction D4 and the length L8 in the third direction D3 of the protruding portion 10b is longer than each of the distance d3 and the distance d4. The length L5 and the length L7 are longer than the length L6 and the length L8, respectively.

The number, shape, and placement of the first portions 11 are not limited to the example shown in FIGS. 3 to 5, but can be modified as appropriate. In the example shown in FIGS. 3 to 5, two protruding portions 10a are provided between the first portions 11 adjacent in the third direction D3. However, one continuous protruding portion 10a may be provided. Likewise, one continuous protruding portion 10b may be provided between the first portions 11 adjacent in the fourth direction D4.

As shown in FIG. 3, at least part of the plurality of first portions 11 are opposed to e.g. the gate interconnect part 32a in the Z-direction. At least part of the plurality of protruding portions 10a and at least part of the plurality of protruding portions 10b are opposed to the emitter electrode 31 in the Z-direction.

An example of the material of each component is described.

The p$^+$-type collector region 1, the n$^+$-type cathode region 2, the n-type field stop region 7, the n$^-$-type semiconductor region 3, the p-type base region 4, the n$^+$-type emitter region 5, and the p$^+$-type contact region 6 contain silicon, silicon carbide, gallium nitride, or gallium arsenide as a semiconductor material. When the semiconductor material is silicon, the n-type impurity can be arsenic, phosphorus, or antimony. The p-type impurity can be boron.

The gate electrode 20 contains a conductive material such as polysilicon.

The gate insulating layer 21 and the insulating layer 22 contain an insulating material such as silicon oxide.

The collector electrode 30, the emitter electrode 31, and the gate pad 32 contain a metal material such as aluminum.

Next, the operation of the semiconductor device 100 is described.

The collector electrode 30 is applied with a positive voltage relative to the emitter electrode 31. In this state, a voltage of a threshold or more is applied to the gate electrode 20. Then, a channel (inversion layer) is formed in a region near the gate insulating layer 21 of the p-type base region 4. Thus, the semiconductor device 100 is turned to the on-state. At this time, through this channel, electrons are injected from the n$^+$-type emitter region 5 into the n$^-$-type semiconductor region 3. Holes are injected from the p$^+$-type collector region 1 into the n$^-$-type semiconductor region 3. Then, when the voltage applied to the gate electrode 20 becomes lower than the threshold, the channel in the p-type base region 4 vanishes. Thus, the semiconductor device 100 is turned to the off-state.

A plurality of semiconductor devices 100 may constitute e.g. a bridge circuit. In this case, when one semiconductor device 100 switches from the on-state to the off-state, an induced electromotive force is applied to the emitter electrode of a different semiconductor device 100 due to the inductance component of the bridge circuit. This activates the FWD in this different semiconductor device 100. Thus, holes are injected from the p-type base region 4 (p$^+$-type contact region 6) into the n$^-$-type semiconductor region 3. Electrons are injected from the n$^+$-type cathode region 2 into the n$^-$-type semiconductor region 3.

The effect of this embodiment is described with reference to a semiconductor device according to a reference example.

Figure 6:
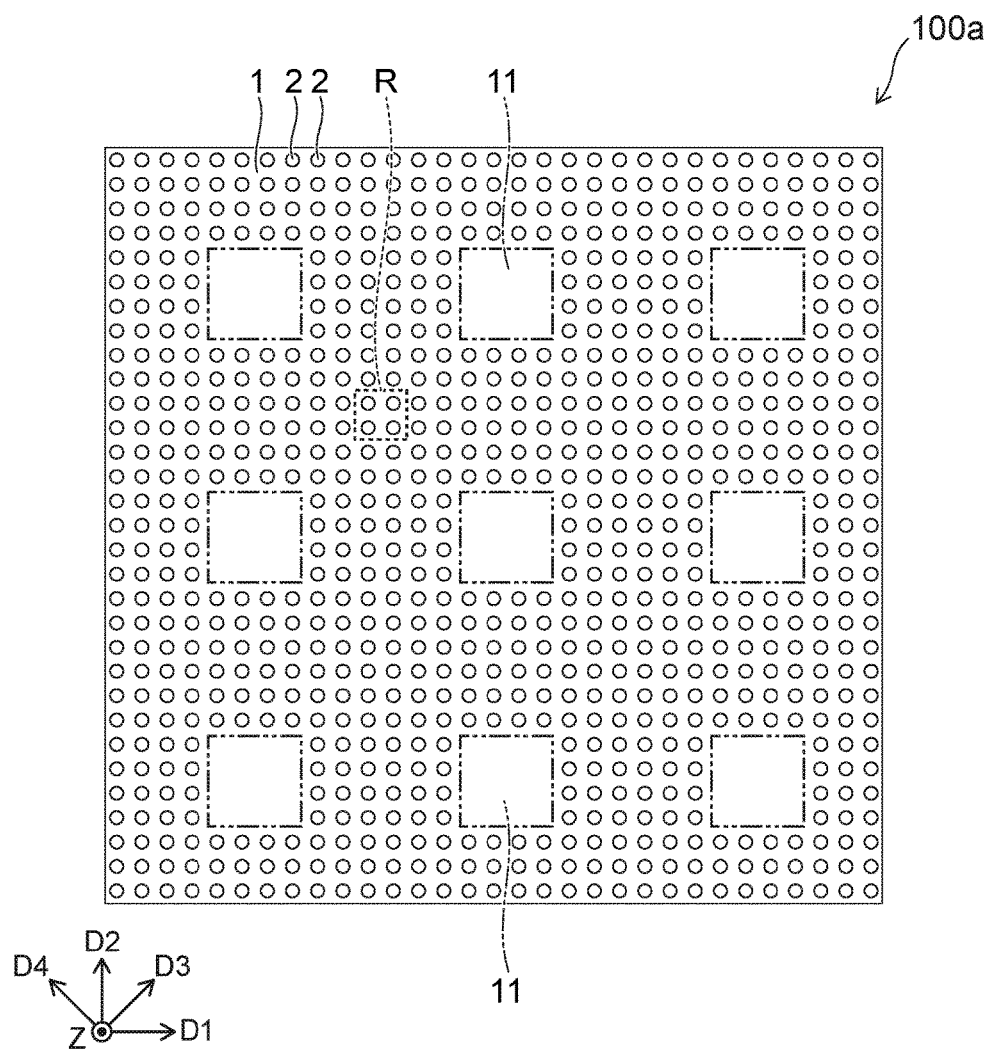
FIG. 6 is a plan view showing the placement of a $p^+$-type collector region and $n^+$-type cathode regions of a semiconductor device according to a reference example.

FIG. 6 is a plan view showing the placement of a p$^+$-type collector region 1 and n$^+$-type cathode regions 2 of a semiconductor device 100a according to a reference example.

As shown in FIG. 6, in the semiconductor device 100a, the p$^+$-type collector region 1 does not include the protruding portions 10a and the protruding portions 10b, but includes only the first portions 11. The configuration of the semiconductor device 100a other than the p$^+$-type collector region 1 and the n$^+$-type cathode region 2 is similar to that of the semiconductor device 100.

As described above, a voltage of the threshold or more is applied to the gate electrode 20, and the semiconductor devices 100 and 100a are turned to the on-state. Then, holes and electrons are injected from the p$^+$-type collector region 1 and the n$^+$-type emitter region 5 into the n$^-$-type semiconductor region 3, respectively. At this time, holes are first injected from the first portions 11, and then successively injected from the region near the first portions 11. Finally, holes are injected from generally the entire surface of the p$^+$-type collector region 1.

In the region subjected to the injection of holes, conductivity modulation occurs, and the electrical resistance of the semiconductor device decreases significantly. Thus, if the time from the start of the injection of holes in the first portions 11 until the occurrence of the injection of holes in the entire surface of the p$^+$-type collector region 1 is shorter, the electrical resistance of the semiconductor device can be decreased in a shorter time. This can reduce power loss at turn-on.

In the case of the semiconductor device 100a according to the reference example, after holes are injected from the first portions 11, the injection of holes gradually spreads to the region near the first portions 11. Thus, the region remote from the first portions 11, like the region R shown in FIG. 6, requires time until the occurrence of the injection of holes.

On the other hand, in the case of the semiconductor device 100 according to this embodiment, when the injection of holes occurs in the first portions 11, the injection of holes occurs next in the protruding portions 10a and the protruding portions 10b. Then, holes are injected from the region near the first portions 11, the protruding portions 10a, and the protruding portions 10b. The protruding portion 10a and the protruding portion 10b protrude from the first portion 11 in the third direction D3 and the fourth direction D4. Thus, the injection of holes occurs in a shorter time also in the region remote from the first portions 11 in the third direction D3 and the fourth direction D4.

That is, the semiconductor device 100 according to this embodiment can reduce switching loss compared with the semiconductor device 100a according to the reference example.

In order to achieve the injection of holes from the entire surface of the p$^+$-type collector region 1 in a shorter time, the dimensions of various parts of the p$^+$-type collector region 1 preferably satisfy the following relations.

Each of the length L1 and the length L2 shown in FIG. 5 is preferably not less than three times and not more than 40 times of the distance d3 or the distance d4. Each of the length L5 and the length L7 is preferably not less than 1.4 times and not more than 19 of the distance d3 or the distance d4. Each of the length L6 and the length L8 is preferably not less than 1.4 times and not more than four times of the distance d3 or the distance d4.

In order to suppress excessive injection of holes from the p$^+$-type collector region 1 and to suppress the decrease of conduction performance in the semiconductor device 100, the ratio of the area of the p$^+$-type collector region 1 to the sum of the area of the p$^+$-type collector region 1 and the area of the n$^+$-type cathode regions 2 at the lower surface of the semiconductor device 100 is preferably not less than 0.80 and not more than 0.95. More preferably, this ratio is not less than 0.85 and not more than 0.90. In the example shown in FIGS. 3 to 5, the ratio of the area of the p$^+$-type collector region 1 to the sum of the area of the p$^+$-type collector region 1 and the area of the n$^+$-type cathode regions 2 is 0.88.

Figure 7:
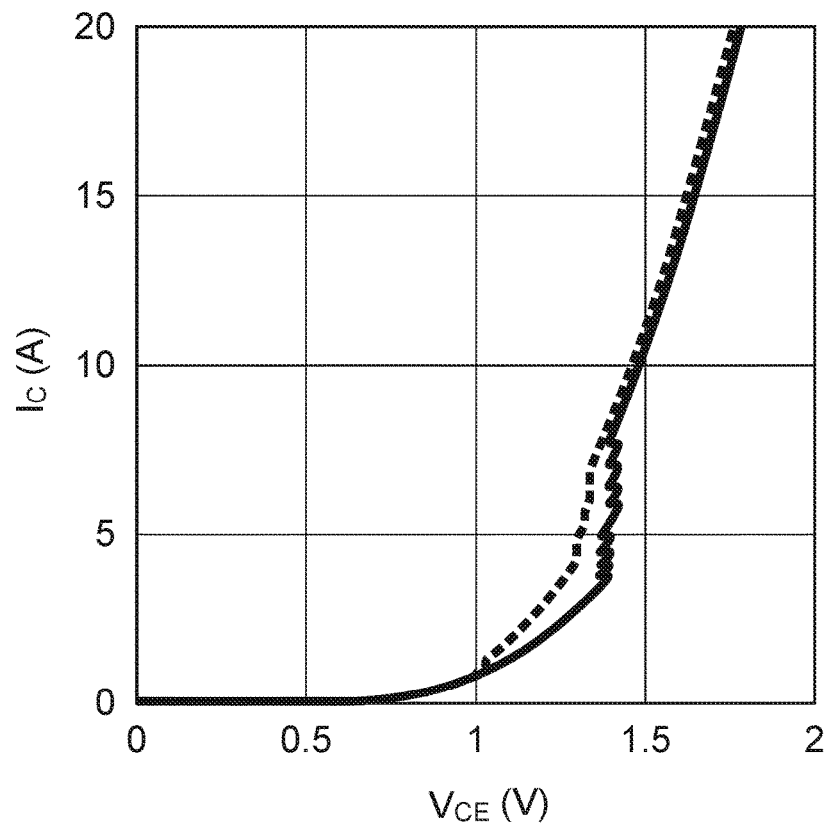
FIGS. 7, 8A, 8B, and 9 are measurement results showing the characteristics of the semiconductor devices according to the first embodiment and the reference example.

FIG. 7 is a measurement result showing the characteristics of the semiconductor devices according to the first embodiment and the reference example.

FIG. 7 shows the variation of current in the case of increasing the application voltage to the collector electrode 30 in the state in which a voltage is applied to the gate electrode for the semiconductor device 100 according to this embodiment and the semiconductor device 100a according to the reference example. In FIG. 7, the horizontal axis represents the voltage of the collector electrode 30 relative to the emitter electrode 31. The vertical axis represents the current flowing in the collector electrode 30. The dashed line represents the measurement result of the semiconductor device 100 according to this embodiment. The solid line represents the measurement result of the semiconductor device 100a according to the reference example.

As shown in FIG. 7, in the semiconductor device 100a according to the reference example, the current gradually increases up to a voltage of 1.4 V. At 1.4 V, the current increases with the occurrence of voltage snapback. Then, when the current reaches approximately 8 A, the current sharply increases.

On the other hand, in the semiconductor device 100 according to this embodiment, the current value at a voltage of 1.0-4.4 V is higher than that of the semiconductor device 100a. There is no voltage snapback associated with the increase of current as in the semiconductor device 100a. When the current reaches approximately 7 A, the current sharply increases.

That is, this measurement result indicates that in the semiconductor device 100, the injection of holes occurs from a large area of the p$^+$-type collector region 1 in a shorter time, and the electrical resistance is lower, than in the semiconductor device 100a.

Figure 8A:
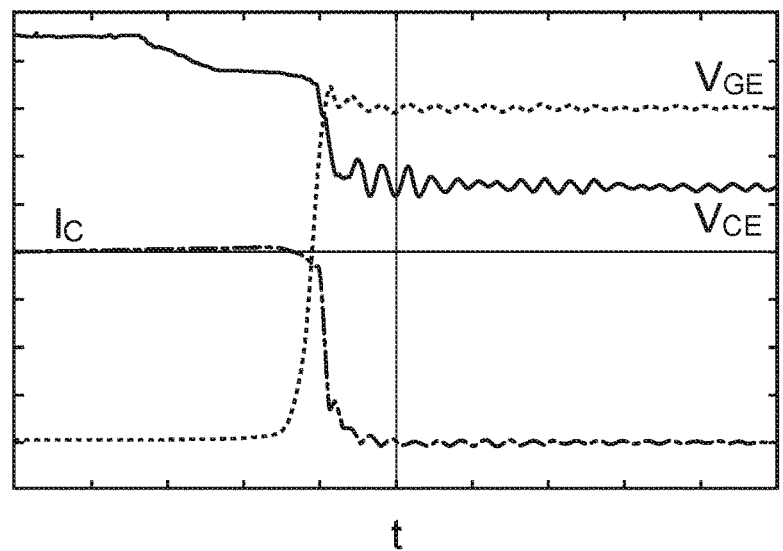
Figure 8B:
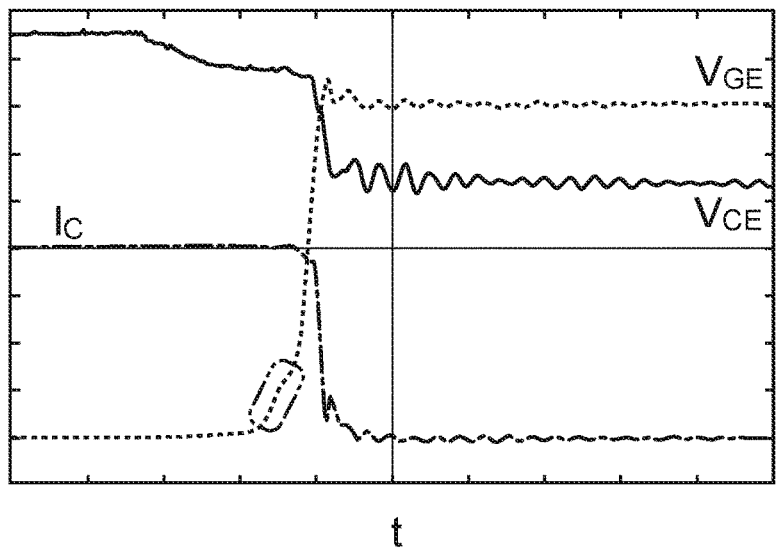

FIGS. 8A and 8B are measurement results showing other characteristics of the semiconductor devices according to the first embodiment and the reference example.

FIGS. 8A and 8B are the results of measuring the variation of the voltage $V_{GE}$ of the gate electrode 20, the voltage $V_{CE}$ of the collector electrode 30, and the current $I_C$ flowing in the collector electrode 30 versus the time t at turn-off for the semiconductor device 100 according to this embodiment and the semiconductor device 100a according to the reference example. FIG. 8A shows the measurement result of the semiconductor device 100 according to this embodiment. FIG. 8B shows the measurement result of the semiconductor device 100a according to the reference example.

In the measurement shown in FIGS. 8A and 8B, the current $I_C$ in the on-state is set equal for the semiconductor devices 100 and 100a.

Comparison between the measurement results of FIGS. 8A and 8B indicates that in the semiconductor device 100a according to the reference example, the time in which the voltage $V_{GE}$ at turn-off varies is longer than in the semiconductor device 100 according to the embodiment.

Specifically, in the semiconductor device 100a according to the reference example, the voltage $V_{GE}$ gradually increases in the region enclosed with the double dot-dashed line of FIG. 8B, and then sharply increases. In contrast, in the semiconductor device 100 according to this embodiment, such a gradual increase of the voltage $V_{GE}$ was not confirmed.

That is, it is found that in the semiconductor device 100 according to this embodiment, the switching time at turn-off is shorter, and power loss is lower, than in the semiconductor device 100a according to the reference example.

Figure 9:
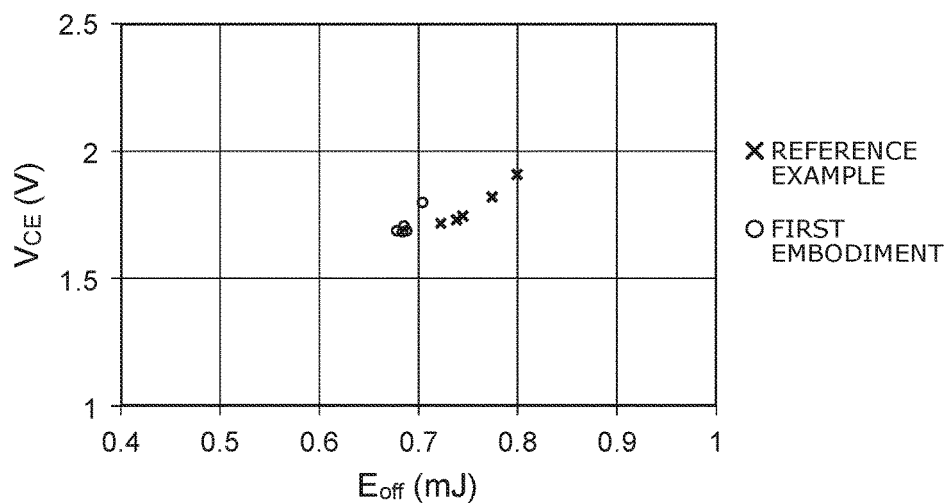

FIG. 9 is a measurement result showing other characteristics of the semiconductor devices according to the first embodiment and the reference example.

In FIG. 9, the vertical axis represents the value of the voltage $V_{CE}$ at which the steady state is reached after turn-off. The horizontal axis represents the power consumption $E_{off}$ at turn-off. FIG. 9 shows the result of measurement for a plurality of semiconductor devices 100 according to the first embodiment and a plurality of semiconductor devices 100a according to the reference example.

The measurement result of FIG. 9 indicates that in the semiconductor device 100 according to this embodiment, the voltage $V_{CE}$ and the power consumption $E_{off}$ have smaller dispersion, and the power consumption $E_{off}$ is lower, than in the semiconductor device 100a according to the reference example.

As described above with reference to various measurement results, this embodiment can reduce power loss (switching loss) at turn-on and at turn-off in the semiconductor device.

(First Variation)

Figure 10:
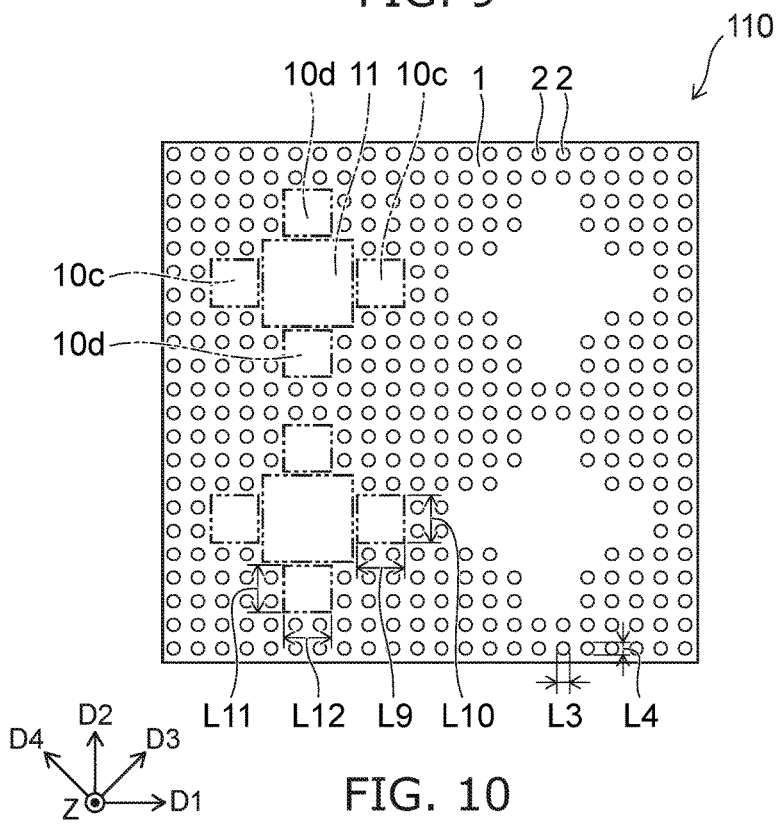
FIG. 10 is a plan view showing the placement of a $p^+$-type collector region and $n^+$-type cathode regions of part of a semiconductor device according to a first variation of the first embodiment.

FIG. 10 is a plan view showing the placement of a p$^+$-type collector region 1 and n$^+$-type cathode regions 2 of part of a semiconductor device 110 according to a first variation of the first embodiment.

The semiconductor device 110 according to this variation is different from the semiconductor device 100 in that the p$^+$-type collector region 1 includes protruding portions 10c and protruding portions 10d instead of the protruding portions 10a and the protruding portions 10b. The rest of the configuration in the semiconductor device 110 is similar to that of the semiconductor device 100.

As shown in FIG. 10, the protruding portion 10c protrudes from the first portion 11 along the first direction D1. The protruding portion 10d protrudes from the first portion 11 along the second direction D2. Part of the plurality of protruding portions 10c are provided between the first portions 11 in the first direction D1. Part of the plurality of protruding portions 10d are provided between the first portions 11 in the second direction D2. The p-type impurity concentrations of the first portion 11, the protruding portion 10c, and the protruding portion 10d are e.g. equal to each other.

Each of the length L9 in the first direction D1 and the length L10 in the second direction D2 of the protruding portion 10c is longer than each of the distance d3 and the distance d4 shown in FIG. 5. Likewise, each of the length L11 in the second direction D2 and the length L12 in the first direction D1 of the protruding portion 10d is longer than each of the distance d3 and the distance d4. Each of the length L1 and the length L2 shown in FIG. 5 is longer than each of the length L10 and the length L12. Each of the length L9 and the length L11 is preferably not less than 1.0 times and not more than 13 times of the distance d3 or the distance d4. Each of the length L10 and the length L12 is preferably not less than 1.3 times and not more than four times of the distance d3 or the distance d4.

In the semiconductor device 110, at turn-on, after holes are injected from the first portions 11, holes are injected next from the protruding portions 10c and the protruding portions 10d. Like the semiconductor device 100, this can reduce the time until the injection of holes from the entire surface of the r-type collector region 1 at turn-on, and can reduce switching loss.

(Second Variation)

Figure 11:
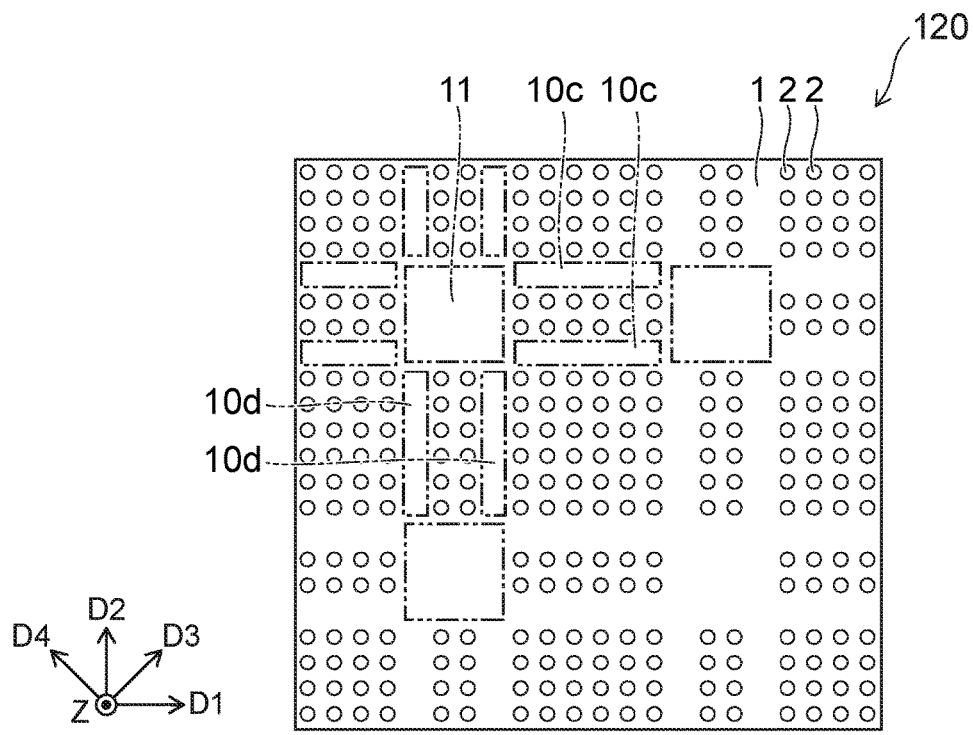
FIG. 11 is a plan view showing the placement of a $p^+$-type collector region and $n^+$-type cathode regions of part of a semiconductor device according to a second variation of the first embodiment.

FIG. 11 is a plan view showing the placement of a $p^+$-type collector region 1 and $n^+$-type cathode regions 2 of part of a semiconductor device 120 according to a second variation of the first embodiment.

In the semiconductor device 120 according to this variation, the protruding portion 10c and the protruding portion 10d are connected to a plurality of first portions 11. The protruding portion 10c is provided in a plurality in the second direction D2 between the first portions 11. The protruding portion 10d is provided in a plurality in the first direction D1 between the first portions 11.

This variation can reduce switching loss as in the semiconductor device 110.

(Third Variation)

Figure 12:
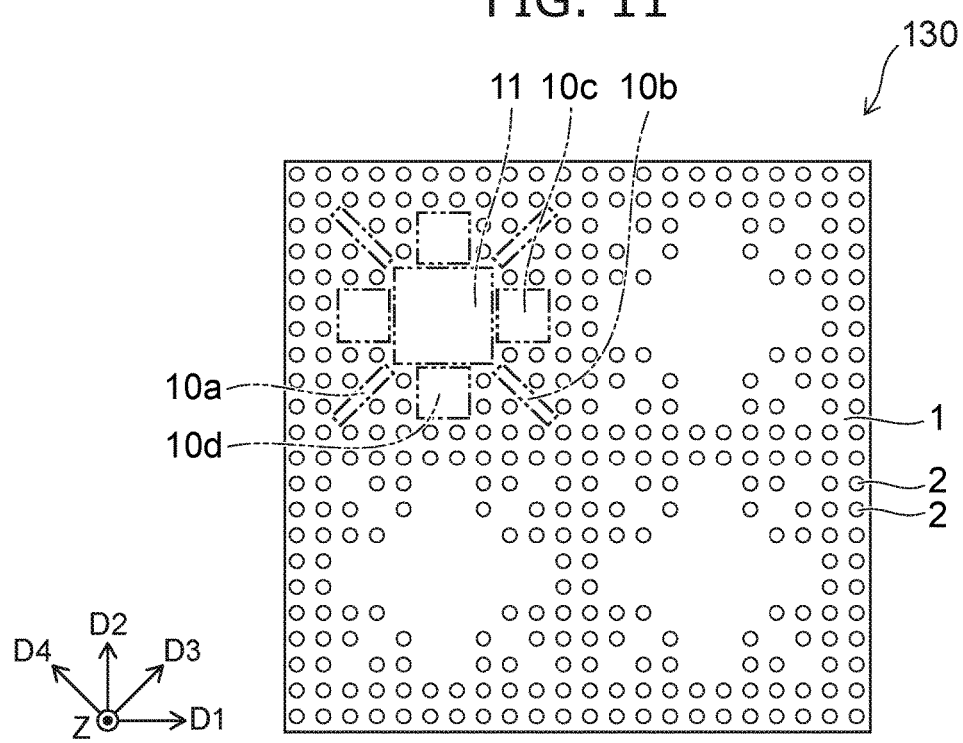
FIG. 12 is a plan view showing the placement of a $p^+$-type collector region and $n^+$-type cathode regions of part of a semiconductor device according to a third variation of the first embodiment.

FIG. 12 is a plan view showing the placement of a $p^+$-type collector region 1 and $n^+$-type cathode regions 2 of part of a semiconductor device 130 according to a third variation of the first embodiment.

The semiconductor device 130 according to this variation is different from the semiconductor device 100 in further including protruding portions 10c and protruding portions 10d. The rest of the configuration in the semiconductor device 130 is similar to that of the semiconductor device 100.

As shown in FIG. 12, the $p^+$-type collector region 1 includes protruding portions 10a-10d. This can further reduce switching loss compared with the semiconductor devices 100-120 described above.

Second Embodiment

Figure 13:
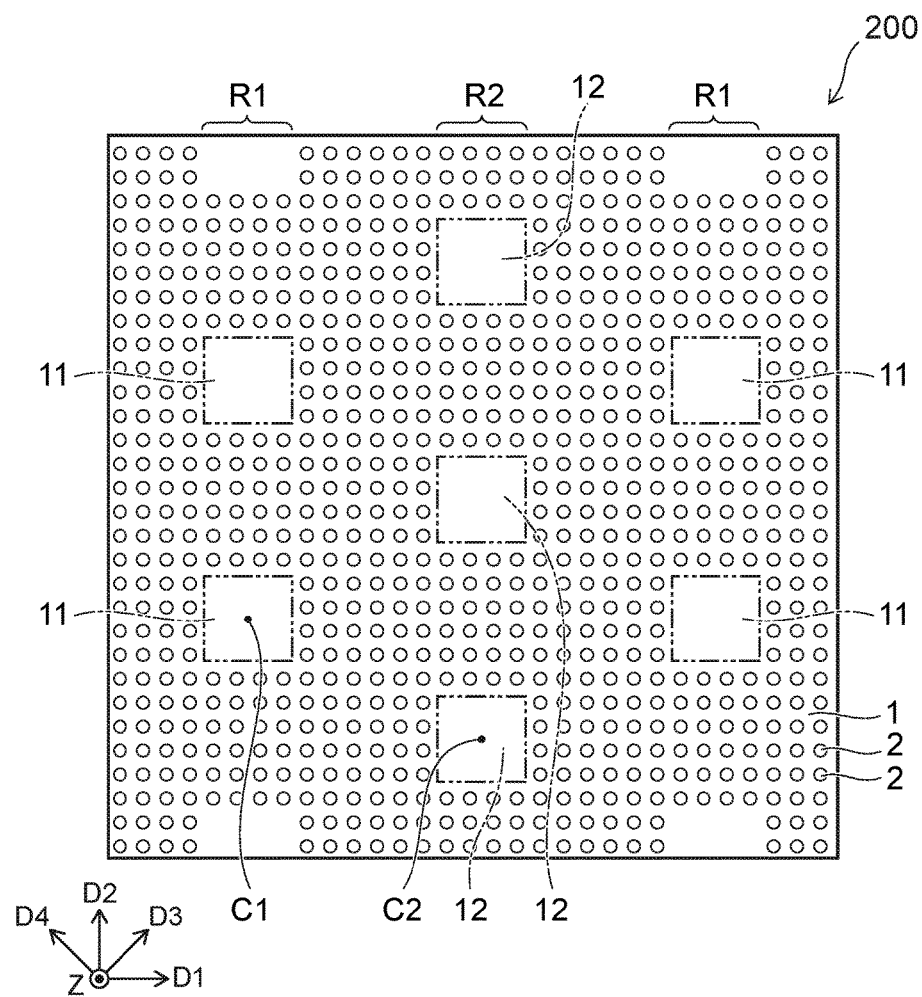
FIG. 13 is a plan view showing the placement of a $p^+$-type collector region and $n^+$-type cathode regions of a semiconductor device according to a second embodiment.

FIG. 13 is a plan view showing the placement of a $p^+$-type collector region 1 and $n^+$-type cathode regions 2 of a semiconductor device 200 according to a second embodiment.

In the semiconductor device 200 according to this embodiment, the $p^+$-type collector region 1 includes a plurality of first portions 11 and a plurality of second portions 12. The $n^+$-type cathode regions 2 are arranged in the first direction D1 and the second direction D2 in the $p^+$-type collector region 1 other than the first portions 11 and the second portions 12. The rest of the configuration in the semiconductor device 200 other than the $p^+$-type collector region 1 and the $n^+$-type cathode region 2 is similar to that of the semiconductor device 100.

The first portions 11 and the second portions 12 are e.g. arranged along the second direction D2 and spaced from each other in the first direction D1. At least part of the first portions 11 and at least part of the second portions 12 are not aligned in the first direction D1. In other words, the plurality of first portions 11 and the plurality of second portions 12 are arranged in a staggered arrangement. Thus, as shown in FIG. 13, with regard to the center C1 in the second direction D2 of the first portion 11 and the center C2 in the second direction D2 of the second portion 12, the coordinate in the second direction D2 of the center C1 is different from the coordinate in the second direction D2 of the center C2.

In the example shown in FIG. 13, the $p^+$-type collector region 1 includes a first row R1 in which a plurality of first portions 11 are arranged in the second direction D2, and a second row R2 in which a plurality of second portions 12 are arranged in the second direction D2. The first rows R1 and the second rows R2 are spaced from each other in the first direction D1 and provided alternately. The p-type impurity concentration in the first portion 11 is e.g. equal to the p-type impurity concentrations in the second portion 12.

Each of the length in the first direction D1 and the length in the second direction D2 of the second portion 12 is longer than each of the distance d3 and the distance d4 shown in FIG. 5. Each of the length in the first direction D1 and the length in the second direction D2 of the second portion 12 is preferably e.g. not less than three times and not more than 40 times of the distance d3 or the distance d4. In the example shown in FIG. 13, the ratio of the area of the $p^+$-type collector region 1 to the sum of the area of the $p^+$-type collector region 1 and the area of the $n^+$-type cathode regions 2 is 0.86.

Such a structure can reduce the distance from the first portions 11 and the second portions 12 to the point remotest from the first portions 11 and the second portions 12 compared with the semiconductor device 100a according to the reference example shown in FIG. 6. Thus, like the first embodiment, this embodiment can reduce the time until the injection of holes from the entire surface of the $p^+$-type collector region 1 at turn-on, and can reduce switching loss.

(First Variation)

Figure 14:
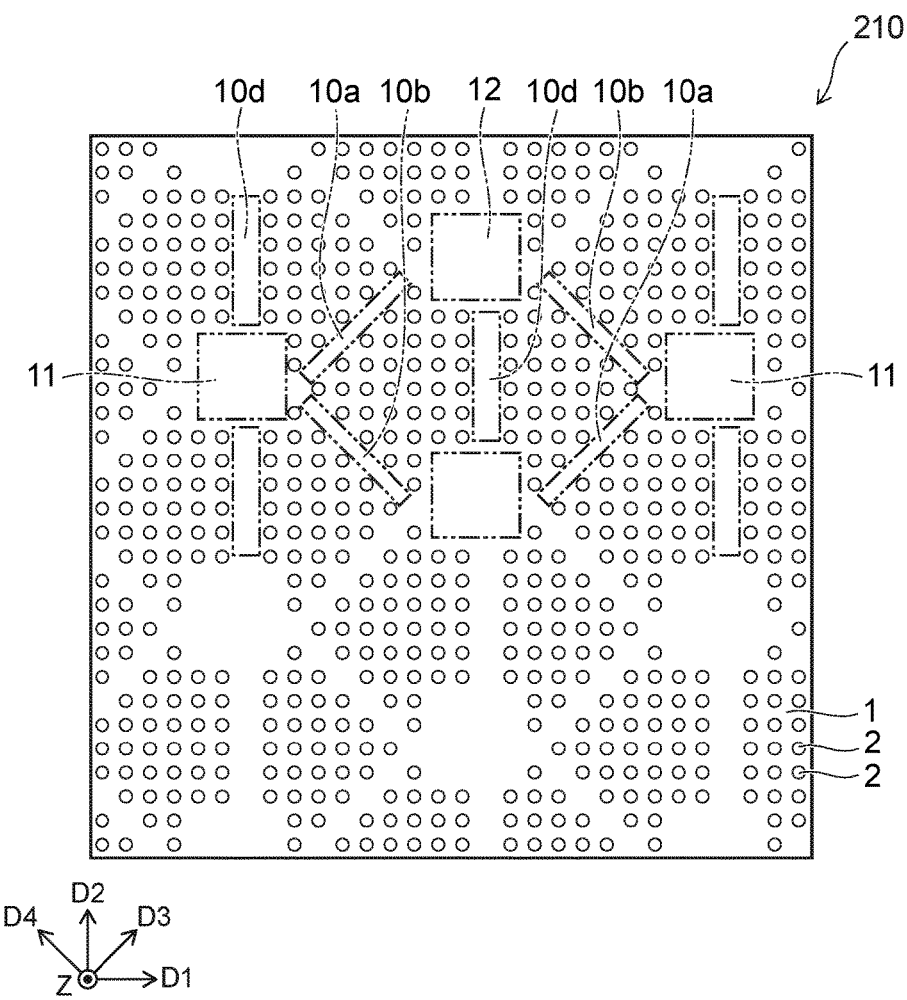
FIG. 14 is a plan view showing the placement of a $p^+$-type collector region and $n^+$-type cathode regions of a semiconductor device according to a first variation of the second embodiment.

FIG. 14 is a plan view showing the placement of a $p^+$-type collector region 1 and $n^+$-type cathode regions 2 of a semiconductor device 210 according to a first variation of the second embodiment.

The semiconductor device 210 is different from the semiconductor device 200 in that the $p^+$-type collector region 1 further includes protruding portions 10a, protruding portions 10b, and protruding portions 10d.

The protruding portion 10a is provided along the third direction D3 between the first portion 11 and the second portion 12. The protruding portion 10b is provided along the fourth direction D4 between the first portion 11 and the second portion 12. The protruding portion 10d is provided along the second direction D2 between the first portions 11 or between the second portions 12. In the example shown in FIG. 14, the ratio of the area of the $p^+$-type collector region 1 to the sum of the area of the $p^+$-type collector region 1 and the area of the $n^+$-type cathode regions 2 is 0.89.

In the example shown in FIG. 14, the protruding portion 10a and the protruding portion 10b are connected to the first portion 11 and the second portion 12. However, part of a plurality of protruding portions 10a may protrude from the first portions 11 along the third direction D3, and other part of the plurality of protruding portions 10a may protrude from the second portions 12 along the third direction D3. In this case, the protruding portion 10a connected to the first portion 11 and the protruding portion 10b connected to the second portion 12 are spaced from each other. Likewise, part of a plurality of protruding portions 10b may protrude from the first portions 11 along the fourth direction D4, and other part of the plurality of protruding portions 10b may protrude from the second portions 12 along the fourth direction D4.

Thus, the $p^+$-type collector region 1 further includes protruding portions 10a, protruding portions 10b, and protruding portions 10d. This can further reduce switching loss compared with the semiconductor device 200.

(Second Variation)

Figure 15:
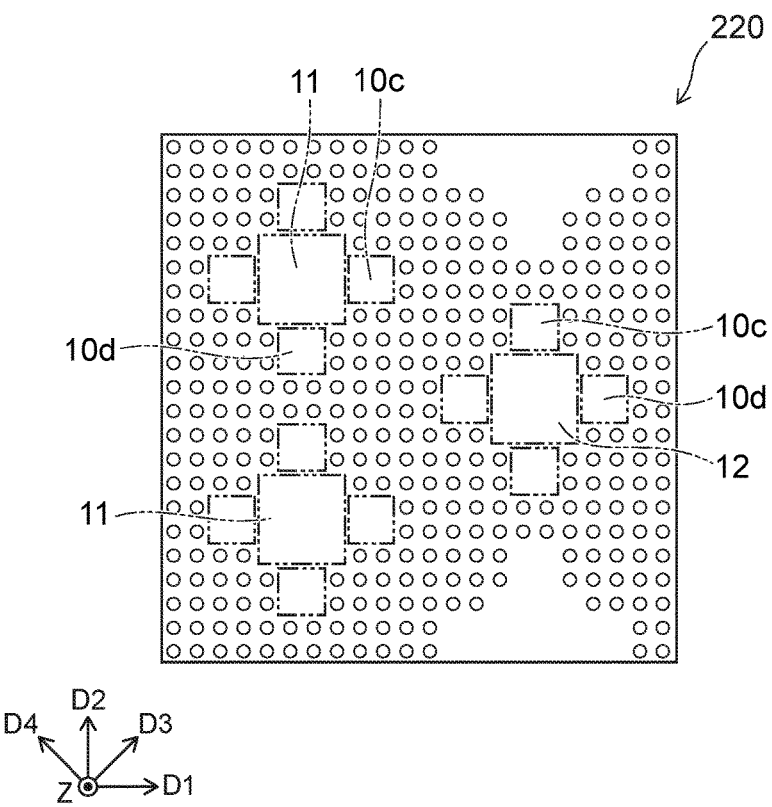
FIG. 15 is a plan view showing the placement of a $p^+$-type collector region and $n^+$-type cathode regions of part of a semiconductor device according to a second variation of the second embodiment.

FIG. 15 is a plan view showing the placement of a $p^+$-type collector region 1 and $n^+$-type cathode regions 2 of part of a semiconductor device 220 according to a second variation of the second embodiment.

The semiconductor device 220 is different from the semiconductor device 200 in that the $p^+$-type collector region 1 further includes protruding portions 10c and protruding portions 10d.

Part of a plurality of protruding portions 10c protrude from the first portions 11 along the first direction D1. Other part of the plurality of protruding portions 10c protrude from the second portions 12 along the first direction D1. Likewise, part of a plurality of protruding portions 10d protrude from the first portions 11 along the second direction D2. Other part of the plurality of protruding portions 10d protrude from the second portions 12 along the second direction D2.

The first portions 11 may be linked to each other by the protruding portion 10d. The second portions 12 may be linked to each other by the protruding portion 10d.

This variation can further reduce switching loss compared with the semiconductor device 200.

(Third Variation)

Figure 16:
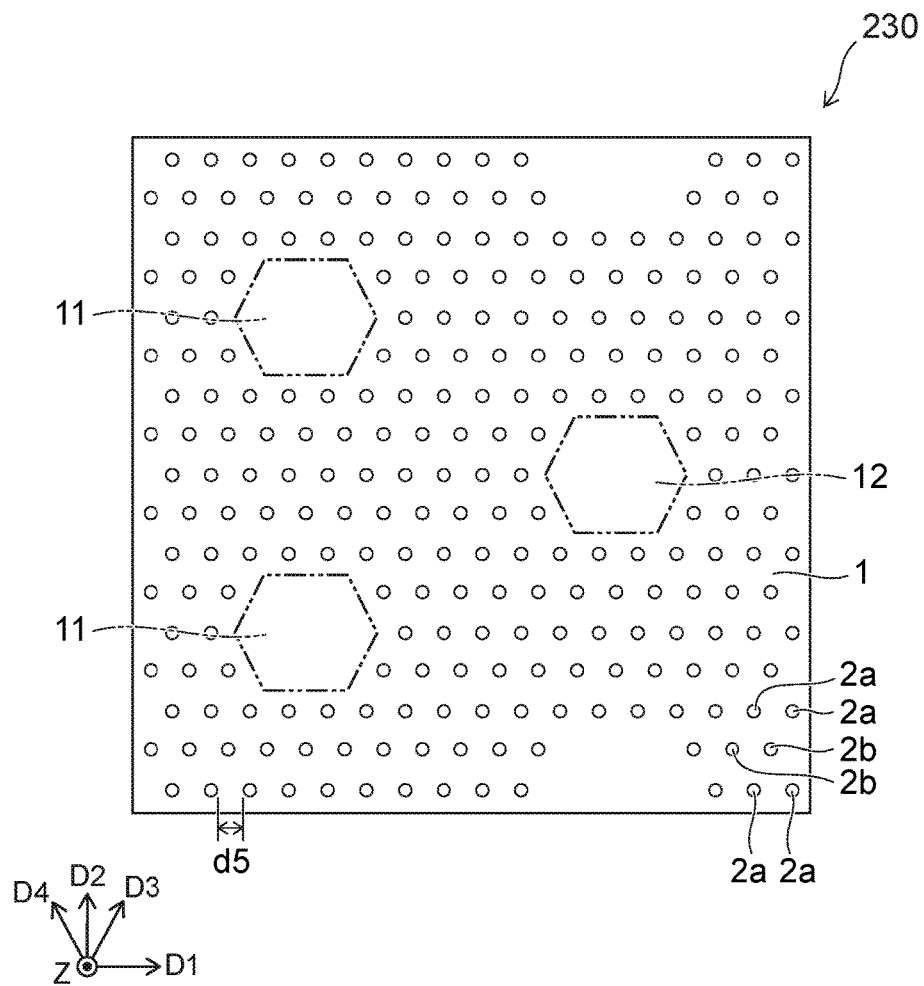
FIG. 16 is a plan view showing the placement of a $p^+$-type collector region and $n^+$-type cathode regions of part of a semiconductor device according to a third variation of the second embodiment.

FIG. 16 is a plan view showing the placement of a $p^+$-type collector region 1 and $n^+$-type cathode regions 2 of part of a semiconductor device 230 according to a third variation of the second embodiment.

The semiconductor device 230 is different from the semiconductor device 200 in the arrangement of cathodes. With the change in the arrangement of cathodes, the shape of the first portion 11 and the second portion 12 is also different from that of the semiconductor device 200.

In the semiconductor device 230, the $n^+$-type cathode regions 2 are arranged in a staggered arrangement. That is, the semiconductor device 230 includes a plurality of $n^+$-type cathode regions 2a and a plurality of $n^+$-type cathode regions 2b arranged along the second direction D2. At least part of the $n^+$-type cathode regions 2a and at least part of the $n^+$-type cathode regions 2b are not aligned in the first direction D1.

In the example shown in FIG. 16, the length in the first direction D1 of the first portion 11 and the second portion 12 is longer than the length in the second direction D2. The outer edge of the first portion 11 and the outer edge of the second portion 12 are e.g. hexagonal.

The distance d5 between the $n^+$-type cathode regions 2a in the first direction D1 is e.g. equal to the distance between the $n^+$-type cathode regions 2b in the first direction D1. The length in the first direction D1 or the second direction D2 of each of the first portion 11 and the second portion 12 is preferably not less than three times and not more than 40 times of the distance d5.

The first portions 11 and the second portions 12 are arranged in a staggered arrangement, and their outer edges are hexagonal. Thus, compared with the semiconductor device 200, the distance from the first portions 11 and the second portions 12 to the point remotest from the first portions 11 and the second portions 12 can be reduced, and switching loss can be reduced, while suppressing the increase of the area of the $p^+$-type collector region 1.

(Fourth Variation)

Figure 17:
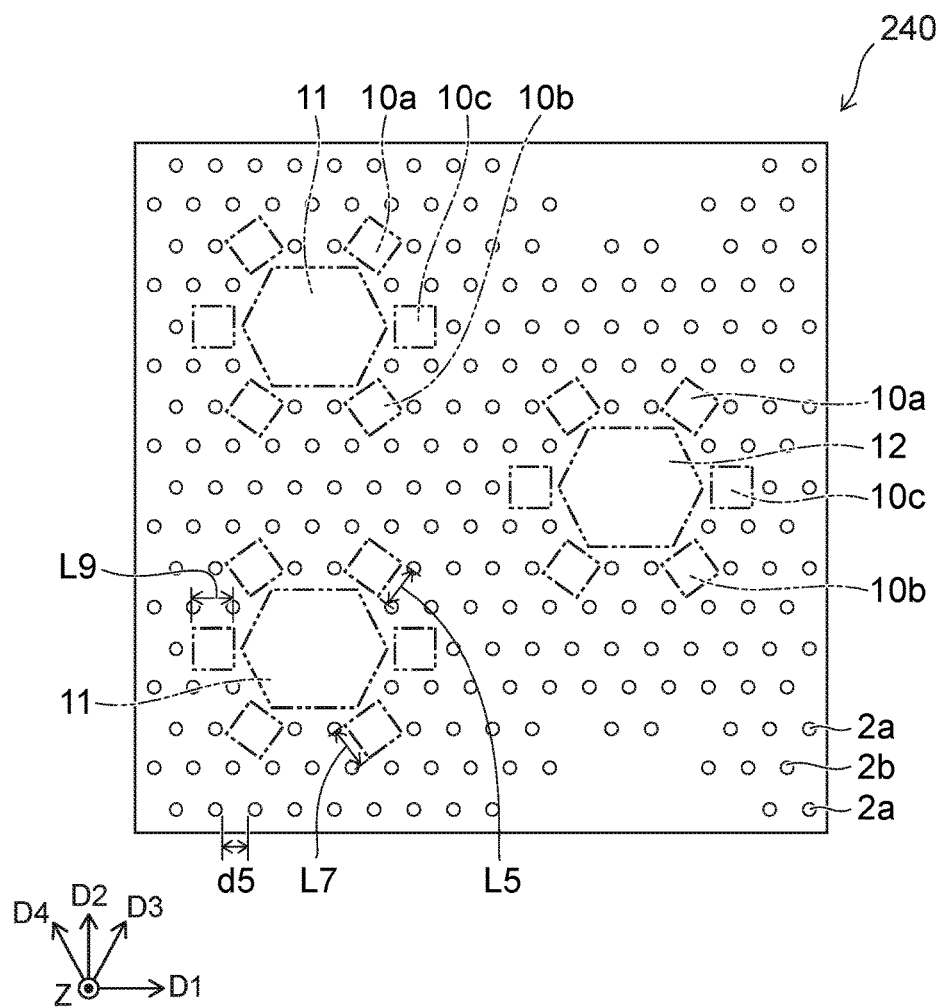
FIG. 17 is a plan view showing the placement of a $p^+$-type collector region and $n^+$-type cathode regions of part of a semiconductor device according to a fourth variation of the second embodiment.

FIG. 17 is a plan view showing the placement of a $p^+$-type collector region 1 and $n^+$-type cathode regions 2 of part of a semiconductor device 240 according to a fourth variation of the second embodiment.

The semiconductor device 240 is different from the semiconductor device 200 in that the $p^+$-type collector region 1 further includes protruding portions 10a, protruding portions 10b, and protruding portions 10c.

The protruding portion 10a, the protruding portion 10b, and the protruding portion 10c protrude from the first portion 11 or the second portion 12 along the third direction D3, the fourth direction D4, and the first direction D1, respectively.

Thus, the $p^+$-type collector region 1 further includes protruding portions 10a, protruding portions 10b, and protruding portions 10c. This can further reduce switching loss compared with the semiconductor device 230.

The length in the respective directions of the protruding portion 10a, the protruding portion 10b, and the protruding portion 10c is not limited to the example shown in FIG. 17, but can be modified as appropriate. The protruding portions may extend between the first portions 11, between the second portions 12, or between the first portion 11 and the second portion 12 so as to link these protruding portions to each other.

For instance, as described with reference to FIG. 5, the length L5 in the third direction D3 of the protruding portion 10a and the length L7 in the fourth direction D4 of the protruding portion 10b are preferably not less than 1.4 times and not more than 19 times of the distance d5. For instance, as described with reference to FIG. 10, the length L9 in the first direction D1 of the protruding portion 10c is preferably not less than 1.0 times and not more than 13 times of the distance d5.

As described above with reference to FIGS. 16 and 17, the arrangement of the $n^+$-type cathode regions 2 and the shape of the outer edge of the first portion 11 and the second portion 12 can be modified as appropriate. In the example described above, the arrangement of the $n^+$-type cathode regions 2 is modified in the semiconductor device according to the second embodiment. However, the $n^+$-type cathode regions 2 may be arranged in a staggered arrangement in the semiconductor device according to the first embodiment.

Third Embodiment

Figure 18:
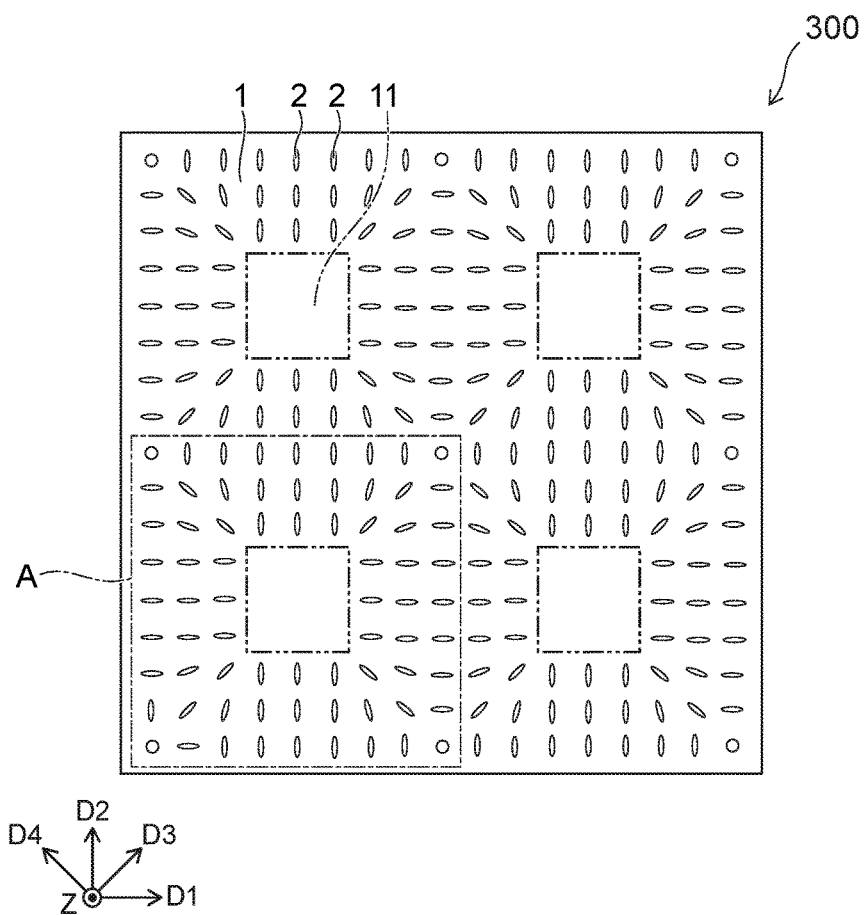
FIG. 18 is a plan view showing the placement of a $p^+$-type collector region and $n^+$-type cathode regions of part of a semiconductor device according to a third embodiment.

FIG. 18 is a plan view showing the placement of a $p^+$-type collector region 1 and $n^+$-type cathode regions 2 of part of a semiconductor device 300 according to a third embodiment.

Figure 19:
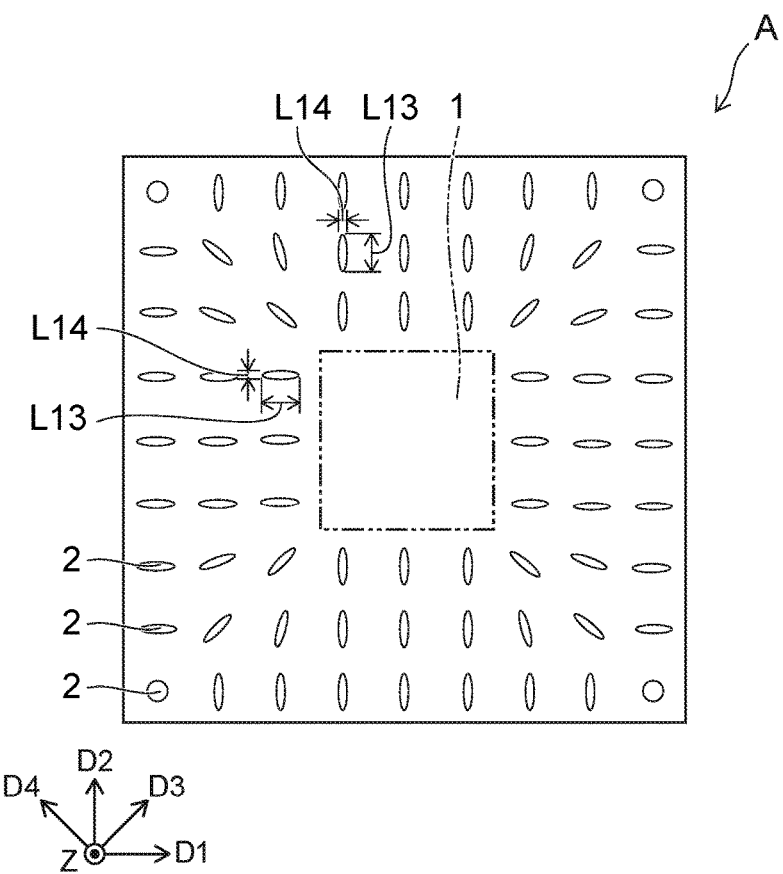
FIG. 19 is a plan view enlarging the region A of FIG. 18.

FIG. 19 is a plan view enlarging the region A of FIG. 18.

The semiconductor device 300 is different from the semiconductor device 100 in the shape of the $n^+$-type cathode region 2.

As shown in FIGS. 18 and 19, in the semiconductor device 300, a plurality of $n^+$-type cathode regions 2 are radially arranged around each first portion 11. Each $n^+$-type cathode region 2 is shaped like an ellipse. The direction to the first portion 11 nearest to the $n^+$-type cathode region 2 is the longitudinal direction of the ellipse. Specifically, as shown in FIG. 19, in each $n^+$-type cathode region 2, the length L13 in the direction from the $n^+$-type cathode region 2 to the first portion 11 is longer than the length L14 in the direction perpendicular to that direction. The shape of the $n^+$-type cathode region 2 is not limited to the example shown in FIGS. 18 and 19. The $n^+$-type cathode region 2 only needs to have a flat shape such as a rectangle in which the direction to the nearest first portion is the longitudinal direction. Alternatively, the n⁺-type cathode region 2 may have a streamline shape in which the width gradually decreases toward the nearest first portion 11.

In such a configuration, after holes are injected in the first portions 11 at turn-on, the injection of holes easily spreads also to the region provided with the n⁺-type cathode regions 2. This can reduce the time until the injection of holes from the entire surface of the p⁺-type collector region 1.

That is, this embodiment can reduce switching loss like the first embodiment and the second embodiment.

(First Variation)

Figure 20:
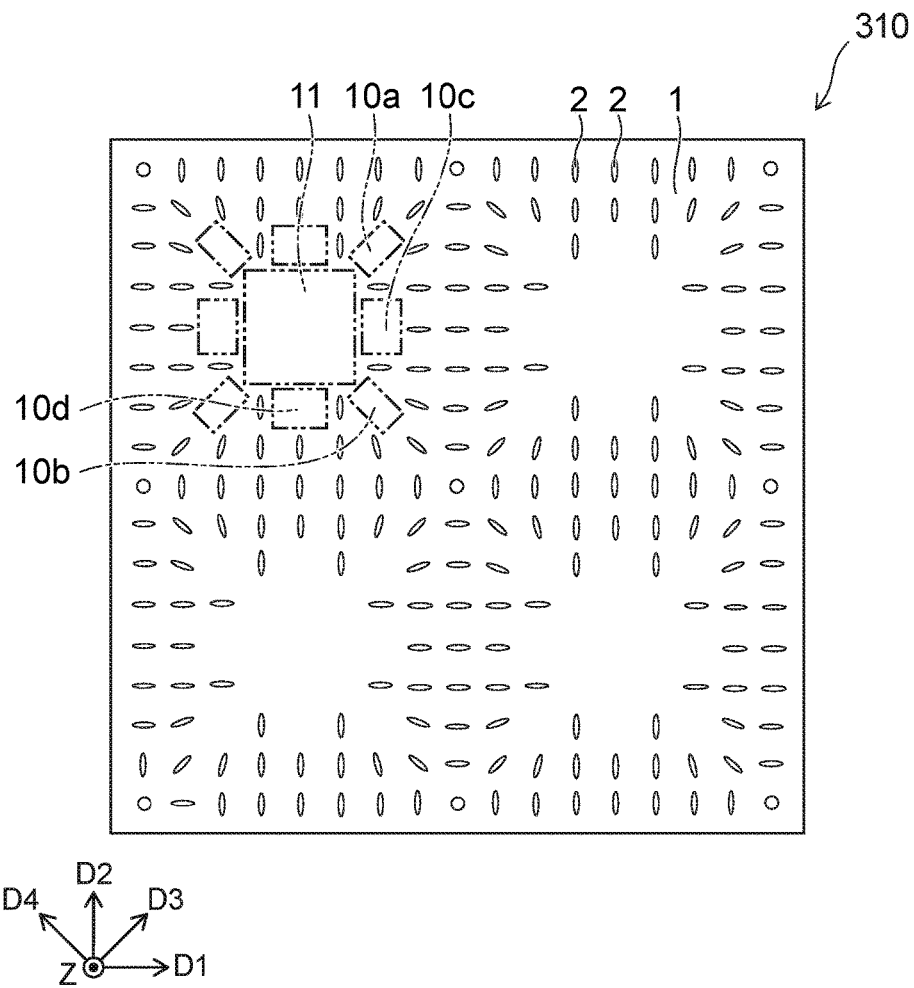
FIG. 20 is a plan view showing the placement of a $p^+$-type collector region and $n^+$-type cathode regions of part of a semiconductor device according to a first variation of the third embodiment.

FIG. 20 is a plan view showing the placement of a p⁺-type collector region 1 and n⁺-type cathode regions 2 of part of a semiconductor device 310 according to a first variation of the third embodiment.

The semiconductor device 310 is different from the semiconductor device 300 in that the p⁺-type collector region 1 further includes protruding portions 10a, protruding portions 10b, protruding portions 10c, and protruding portions 10d.

The length in the respective directions of each protruding portion is not limited to the example shown in FIG. 20, but can be modified as appropriate. The protruding portions may extend between the first portions 11 so as to link these protruding portions to each other.

The p⁺-type collector region 1 further includes protruding portions 10a-10d. This can further reduce switching loss compared with the semiconductor device 300.

(Second Variation)

Figure 21:
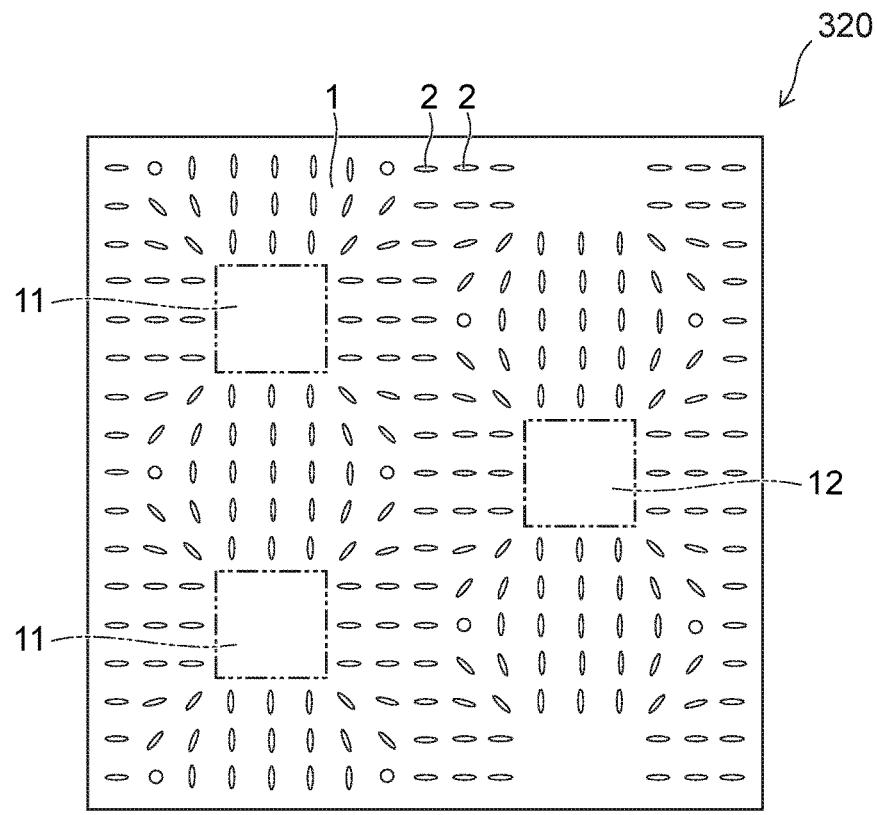
FIG. 21 is a plan view showing the placement of a $p^+$-type collector region and $n^+$-type cathode regions of part of a semiconductor device according to a second variation of the third embodiment.

FIG. 21 is a plan view showing the placement of a p⁺-type collector region 1 and n⁺-type cathode regions 2 of part of a semiconductor device 320 according to a second variation of the third embodiment.

In the semiconductor device 300, a plurality of first portions 11 are arranged along the first direction D1 and the second direction D2. In contrast, in the semiconductor device 320, a plurality of first portions 11 and a plurality of second portions 12 are arranged in a staggered arrangement.

A plurality of n⁺-type cathode regions 2 are radially arranged around the first portion 11 and the second portion 12. Each n⁺-type cathode region 2 has a flat shape. The direction to the nearest first portion 11 or second portion 12 is the longitudinal direction.

Compared with the semiconductor device 300, this variation can reduce the distance from the first portions 11 and the second portions 12 to the point remotest from the first portions 11 and the second portions 12, and can further reduce switching loss.

Fourth Embodiment

Figure 22:
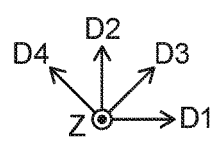
FIG. 22 is a schematic diagram illustrating the configuration of an electrical apparatus according to a fourth embodiment.
Figure 22:
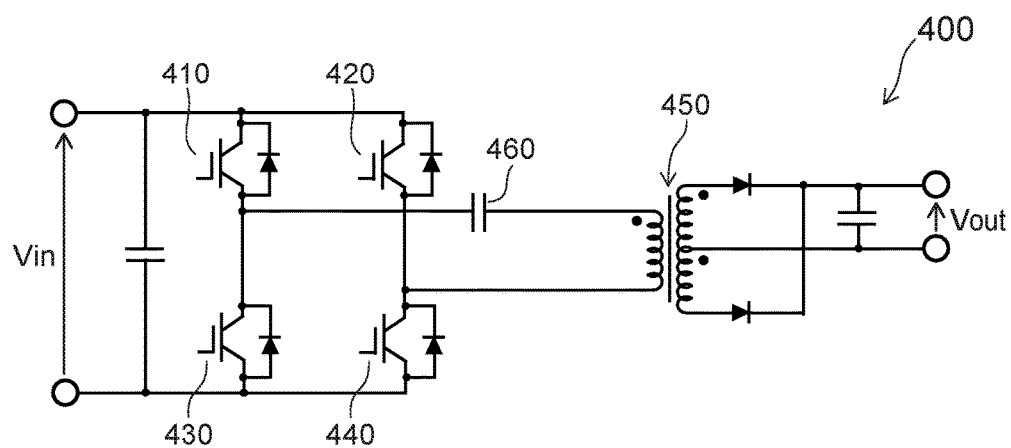

FIG. 22 is a schematic diagram illustrating the configuration of an electrical apparatus 400 according to a fourth embodiment.

The electrical apparatus 400 is e.g. a full-bridge DC/DC converter for converting an inputted DC voltage $V_{in}$ to a different DC voltage $V_{out}$.

The electrical apparatus 400 includes semiconductor devices 410-440 constituting the full-bridge. The semiconductor devices 410-440 are semiconductor devices according to any of the first to third embodiments described above. The semiconductor devices 410-440 are suitably combined and switched to energize a transformer 450. As shown in FIG. 22, a capacitor 460 may be connected to the primary winding of the transformer 450.

In such an electrical apparatus 400, if there is large dispersion of switching rate among the semiconductor devices 410-440, bias magnetism is more likely to occur, and the semiconductor devices are more prone to destruction. If there is high power loss in the semiconductor devices 410-440, the amount of heat generation increases, and bias magnetism is more likely to occur. Thus, the semiconductor devices 410-440 included in the electrical apparatus 400 are desired to have lower power loss and smaller dispersion of switching rate among these semiconductor devices.

Figure 23A:
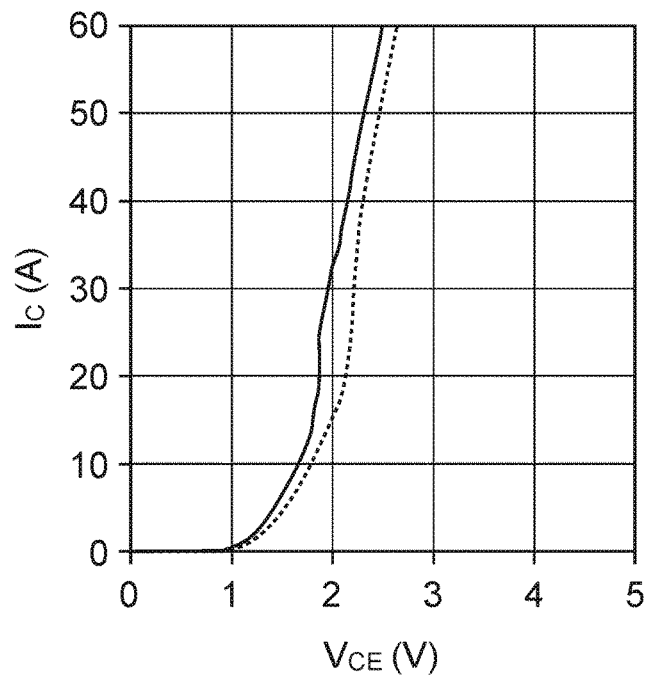
FIG. 23A is a measurement result of the semiconductor device according to the first embodiment and FIG. 23B is a measurement result of the semiconductor device according to the reference example shown in FIG. 6.
Figure 23B:
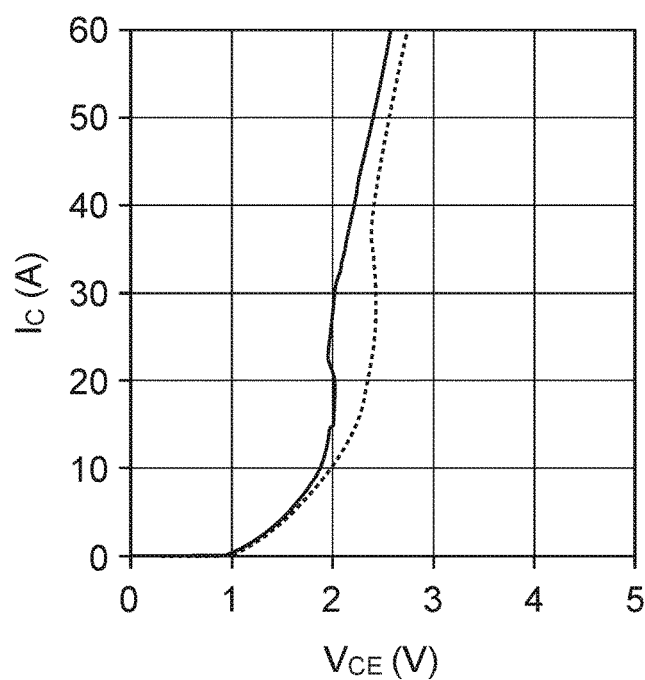
Figure 24A:
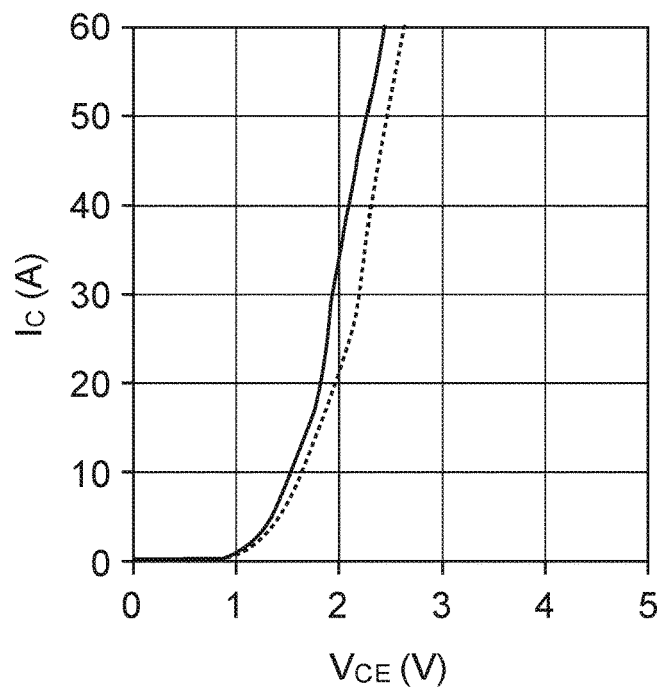
FIG. 24A is a measurement result of the semiconductor device according to the second embodiment and FIG. 24B is a measurement result of the semiconductor device according to the first variation of the second embodiment.
Figure 24B:
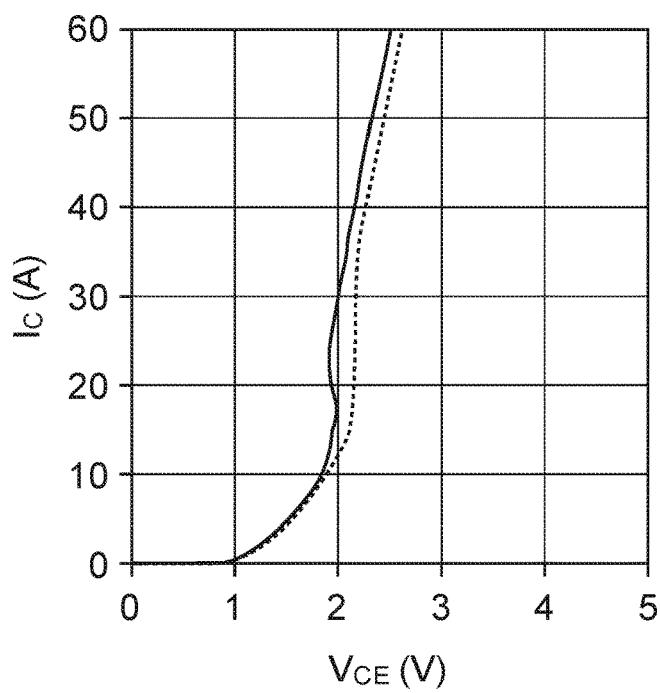

FIG. 23A is a measurement result of the semiconductor device 100 according to the first embodiment. FIG. 23B is a measurement result of the semiconductor device 100a according to the reference example shown in FIG. 6. FIG. 24A is a measurement result of the semiconductor device 200 according to the second embodiment. FIG. 24B is a measurement result of the semiconductor device 210 according to the first variation of the second embodiment. FIGS. 23A to 24B show the variation of the current $I_C$ flowing in the collector electrode 30 when the voltage $V_{CE}$ of the collector electrode 30 is increased. Each measurement is performed for a plurality of semiconductor devices. In each graph, the measurement result of one semiconductor device is shown by the solid line, and the measurement result of another semiconductor device is shown by the dashed line.

Comparison between FIGS. 23A and 23B indicates that the semiconductor device 100a has larger dispersion in the variation of the current $I_C$ versus the voltage $V_{CE}$ than the semiconductor device 100. Likewise, comparison among FIGS. 23B, 24A, and 24B indicates that the semiconductor device 100a has larger dispersion in the variation of the current $I_C$ versus the voltage $V_{CE}$ than the semiconductor devices 200 and 210. That is, the semiconductor devices according to the embodiments have smaller dispersion of the time required for switching at turn-on than the semiconductor device according to the reference example.

As described above, in order to suppress bias magnetism, the dispersion of switching rate is desired to be smaller among the semiconductor devices 410-440 included in the electrical apparatus 400. Thus, bias magnetism in the electrical apparatus 400 can be suppressed by using the semiconductor device according to any of the embodiments as the semiconductor devices 410-440 included in the electrical apparatus 400. The embodiments can reduce switching loss. This can further suppress the occurrence of bias magnetism.

The reason for small dispersion of switching rate in the semiconductor device according to the embodiments is considered as follows.

In the semiconductor device according to the embodiments, the p-type impurity concentration in the p⁺-type collector region 1 is preferably $8.0 \times 10^{16}$-$6.0 \times 10^{17}$ atoms/cm³ in order to suppress excessive injection of holes from the p⁺-type collector region 1. At such a relatively low p-type impurity concentration, slight contamination of the surface of the p⁺-type collector region 1 in manufacturing the semiconductor device and minute dispersion in the manufacturing process may lead to large variation in the characteristics of the p⁺-type collector region 1.

As a result, in the semiconductor device 100a according to the reference example, after holes are injected in the first portions 11, the injection of holes spreads from the first portions 11 in various manners and directions depending on the semiconductor devices. It is considered that this increases dispersion in the time until the injection of holes from the entire surface of the p⁺-type collector region 1.

On the other hand, as described above, the semiconductor device according to the embodiments is configured so that the injection of holes occurs more rapidly in the entire surface of the p⁺-type collector region 1. Thus, even when there is contamination of the surface of the p⁺-type collector region 1 or dispersion in the manufacturing process, the dispersion of switching time due to these factors can be alleviated and reduced.

In FIG. 22, the electrical apparatus 400 is described with reference to the configuration including a full-bridge circuit based on a plurality of semiconductor devices according to the embodiments. However, the mode of the electrical apparatus 400 is not limited thereto. For instance, the electrical apparatus 400 may include a half-bridge circuit based on a plurality of semiconductor devices according to the embodiments.

It is possible to confirm the relative levels of the impurity concentrations of the semiconductor regions in the embodiments described above, for example, using a SCM (scanning capacitance microscope). The carrier concentrations of the semiconductor regions may be considered to be equal to the activated impurity concentrations of the semiconductor regions. Accordingly, the relative levels of the carrier concentrations of the semiconductor regions can be confirmed using SCM. It is possible to measure the impurity concentrations of the semiconductor regions, for example, using a SIMS (secondary ion mass spectrometer).

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention. Moreover, above-mentioned embodiments can be combined mutually and can be carried out.

What is claimed is:
1. A semiconductor device comprising:
a first electrode;
a first semiconductor region of a first conductivity type provided on the first electrode, the first semiconductor region including a plurality of first portions and a plurality of first protruding portions,
the first portions being arranged along a first direction and a second direction perpendicular to the first direction, and
the first protruding portions respectively protruding from the first portions;
a plurality of second semiconductor regions of a second conductivity type spaced from each other, the second semiconductor regions being provided in the first semiconductor region other than the first portions and the first protruding portions;
a third semiconductor region of the second conductivity type provided on the first semiconductor region and the second semiconductor regions;
a fourth semiconductor region of the first conductivity type provided on the third semiconductor region;
a fifth semiconductor region of the second conductivity type selectively provided on the fourth semiconductor region;
a gate electrode opposed to the fourth semiconductor region with a gate insulating layer interposed; and
a second electrode provided on the fifth semiconductor region.
2. The device according to claim 1, wherein length in the first direction of the first portion is not less than three times and not more than 40 times of distance in the first direction between the second semiconductor regions.
3. The device according to claim 1, wherein
the first protruding portion protrudes from the first portion along a third direction crossing the first direction and the second direction, and
length in the third direction of the first protruding portion is longer than length in a fourth direction perpendicular to the third direction of the first protruding portion.
4. The device according to claim 3, wherein
length in the first direction of the first portion is longer than the length in the third direction of the first protruding portion, and
the length in the third direction of the first protruding portion is not less than 1.4 times and not more than 19 times of distance in the first direction between the second semiconductor regions.
5. The device according to claim 4, wherein
the first semiconductor region further includes a plurality of second protruding portions, and
the second protruding portions each protrude from the first portions along the fourth direction perpendicular to the third direction.
6. The device according to claim 5, wherein length in the fourth direction of the second protruding portion is not less than 1.4 times and not more than 19 times of the distance in the first direction between the second semiconductor regions.
7. The device according to claim 1, wherein
the first protruding portion protrudes from the first portion along the first direction, and
length in the third direction of the first protruding portion is not less than 1.0 times and not more than 13 times of distance in the first direction between the second semiconductor regions.
8. The device according to claim 7, wherein
length in the first direction of the first portion is longer than length in the second direction of the first protruding portion, and
the length in the second direction of the first protruding portion is not less than 1.3 times and not more than four times of the distance in the first direction between the second semiconductor regions.
9. The device according to claim 8, wherein
the first semiconductor region further includes a plurality of second protruding portions, and
the second protruding portions each protrude from the first portions along the second direction.
10. The device according to claim 9, wherein length in the second direction of the second protruding portion is not less than 1.0 times and not more than 13 times of the distance in the first direction between the second semiconductor regions.
11. The device according to claim 1, further comprising:
a third electrode spaced from the second electrode,
wherein the third electrode is electrically connected to the gate electrode, and
at least part of the first portions are opposed to the gate electrode in a fifth direction from the first electrode to the second electrode.
12. The device according to claim 11, wherein at least part of the first protruding portions are opposed to the gate electrode in the fifth direction.
13. A semiconductor device comprising:
a first electrode;
a first semiconductor region of a first conductivity type provided on the first electrode, the first semiconductor region including a plurality of first portions and a plurality of second portions, the first portions being arranged along a first direction and spaced from each other, the second portions being arranged along the first direction, the second portions being spaced from each other, the second portions being spaced from the first portions in a second direction perpendicular to the first direction, and at least part of the first portions being not aligned with at least part of the second portions in the second direction;

a plurality of second semiconductor regions of a second conductivity type spaced from each other, the second semiconductor regions being provided in the first semiconductor region other than the first portions and the second portions;

a third semiconductor region of the second conductivity type provided on the first semiconductor region and the second semiconductor regions;

a fourth semiconductor region of the first conductivity type provided on the third semiconductor region;

a fifth semiconductor region of the second conductivity type selectively provided on the fourth semiconductor region;

a gate electrode opposed to the fourth semiconductor region with a gate insulating layer interposed; and a second electrode provided on the fifth semiconductor region.

14. The device according to claim 13, wherein length in the first direction of the first portion is not less than three times and not more than 40 times of distance in the first direction between the second semiconductor regions.

15. The device according to claim 13, wherein the first semiconductor region further includes a plurality of first protruding portions provided along a third direction crossing the first direction and the second direction, and the first protruding portions are each provided between of first portions and the second portions.

16. The device according to claim 13, wherein the first semiconductor region includes a plurality of first protruding portions, part of the first protruding portions each protrude from the first portions along a third direction crossing the first direction and the second direction, and other part of the first protruding portions each protrude from the second portions along the third direction.

17. The device according to claim 13, wherein part of the second semiconductor regions are provided around one of the first portions, and length in a direction from the part of the second semiconductor regions to the one first portion is longer than length in a direction perpendicular to the direction.

18. A semiconductor device comprising:

a first electrode;

a first semiconductor region of a first conductivity type provided on the first electrode, the first semiconductor region including a plurality of first portions, the first portions being arranged along a first direction and a second direction perpendicular to the first direction;

a plurality of second semiconductor regions of a second conductivity type provided in the first semiconductor region other than the first portions and spaced from each other, part of the second semiconductor regions being provided around one of the first portions, and length of one of the second semiconductor region in a direction from the part of the second semiconductor regions to the one of the first portions being longer than length of the one of the second semiconductor region in a direction perpendicular to the direction;

a third semiconductor region of the second conductivity type provided on the first semiconductor region and the second semiconductor regions;

a fourth semiconductor region of the first conductivity type provided on the third semiconductor region;

a fifth semiconductor region of the second conductivity type selectively provided on the fourth semiconductor region;

a gate electrode opposed to the fourth semiconductor region with a gate insulating layer interposed; and a second electrode provided on the fifth semiconductor region.

19. The device according to claim 18, wherein the first semiconductor region further includes a plurality of first protruding portions, and the first protruding portions each protrude from the first portions.

20. An electrical apparatus comprising:

a plurality of the semiconductor devices according to claim 1; and a bridge circuit constituted by the semiconductor devices.

* * * * *